(12) United States Patent
Yamaguchi et al.

(10) Patent No.: US 7,910,984 B2
(45) Date of Patent: Mar. 22, 2011

(54) SEMICONDUCTOR DEVICE AND METHOD FOR MANUFACTURING SAME

(75) Inventors: Yoshihiro Yamaguchi, Saitama-ken (JP); Yusuke Kawaguchi, Kanagawa-ken (JP); Miwako Akiyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 169 days.

(21) Appl. No.: 12/355,591

(22) Filed: Jan. 16, 2009

(65) Prior Publication Data

US 2009/0184352 A1   Jul. 23, 2009

(30) Foreign Application Priority Data

Jan. 18, 2008 (JP) ................................. 2008-008782

(51) Int. Cl.
*H01L 29/76* (2006.01)

(52) U.S. Cl. ................. 257/328; 257/E29.189

(58) Field of Classification Search .................. 257/302, 257/326, 328, 330, 338, E27.054, E29.189, 257/E21.609
See application file for complete search history.

(56) References Cited

U.S. PATENT DOCUMENTS 5,760,440 A * 6/1998 Kitamura et al. ............. 257/328

FOREIGN PATENT DOCUMENTS

| JP | H09-213956 | 8/1997 |
| JP | 2005-294464 | 10/2005 |

* cited by examiner

*Primary Examiner* — Quoc D Hoang
(74) *Attorney, Agent, or Firm* — Patterson & Sheridan, LLP

(57) ABSTRACT

A semiconductor device includes: a semiconductor substrate; a lateral MOSFET formed in an upper portion of a first region of the semiconductor substrate; a vertical MOSFET formed in a second region of the semiconductor substrate; a backside electrode formed on a lower surface of the semiconductor substrate and connected to a lower region of source/drain regions of the vertical MOSFET; and a connecting member penetrating the semiconductor substrate and connecting one of source/drain regions of the lateral MOSFET to the backside electrode.

17 Claims, 18 Drawing Sheets

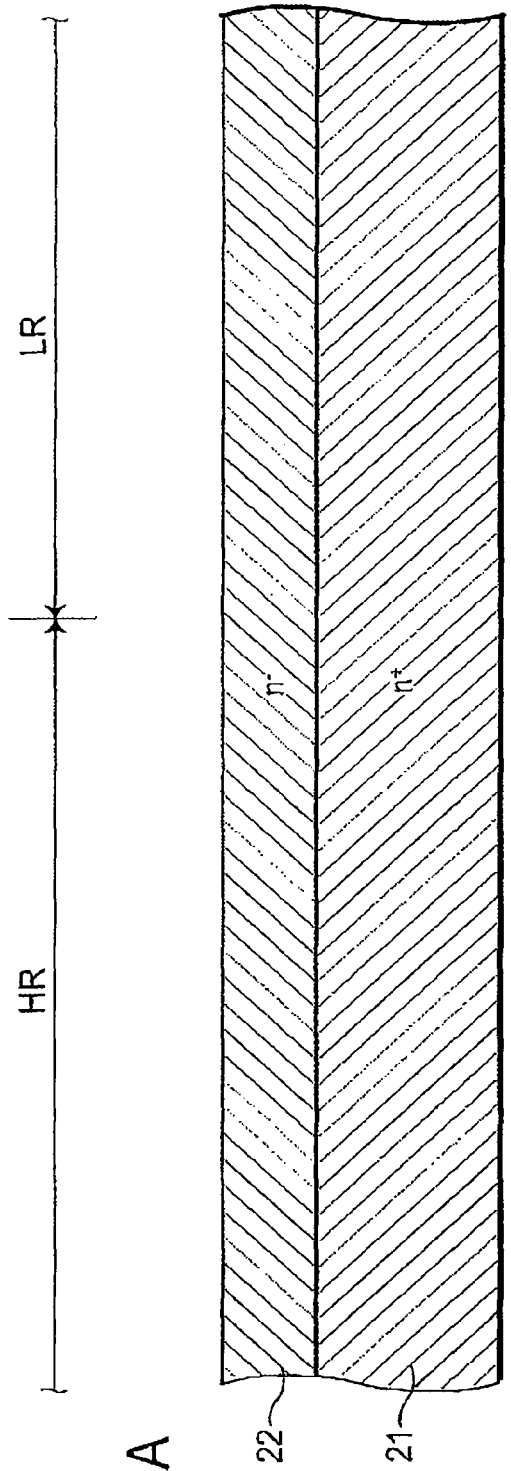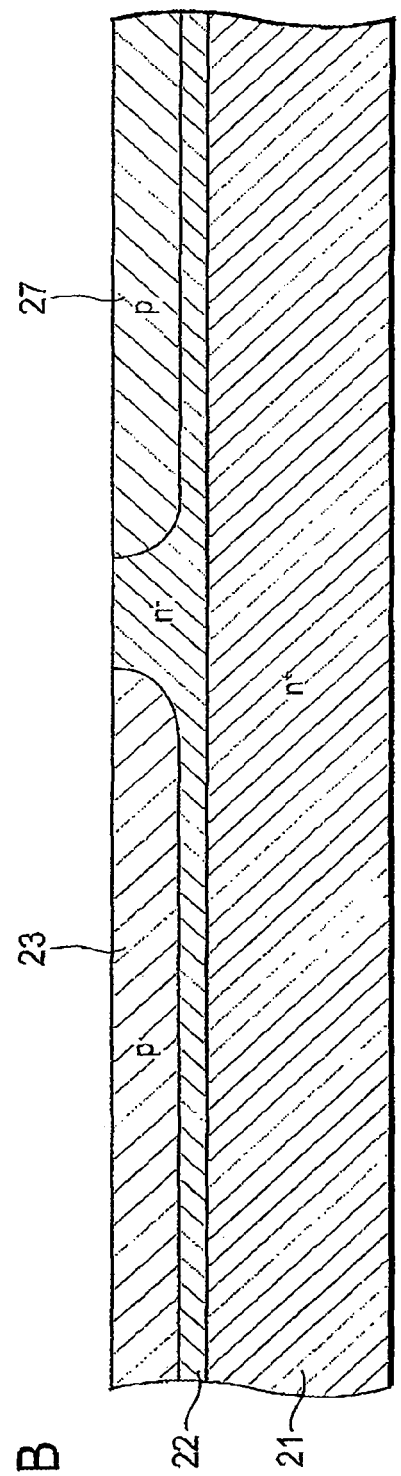
FIG. 4A
FIG. 4B

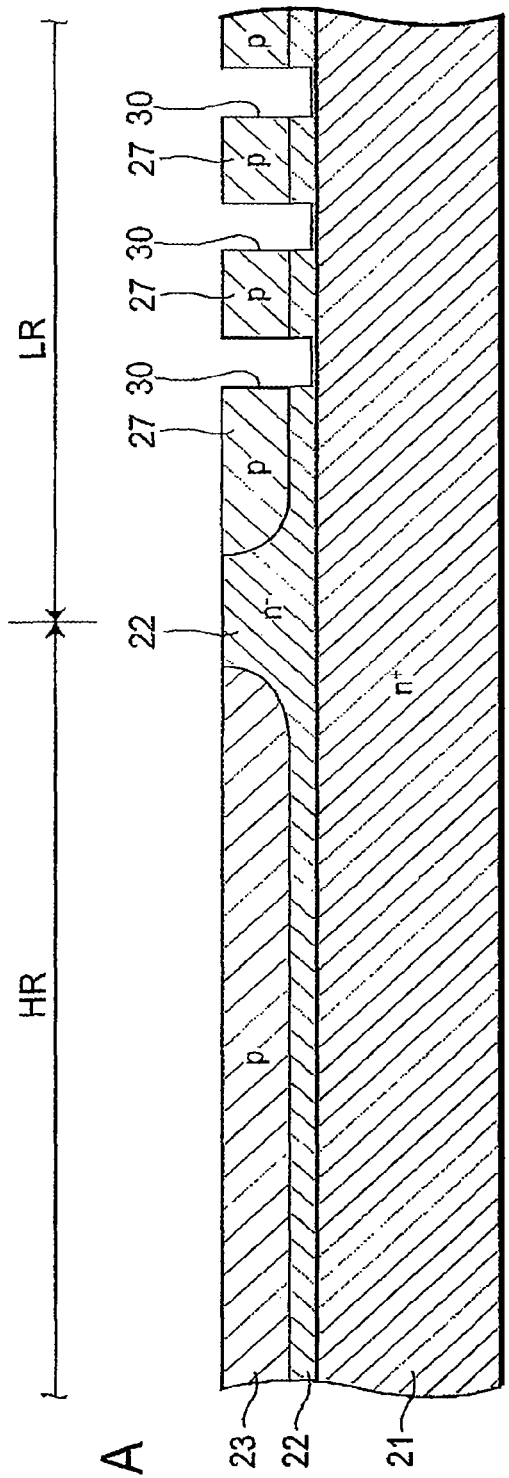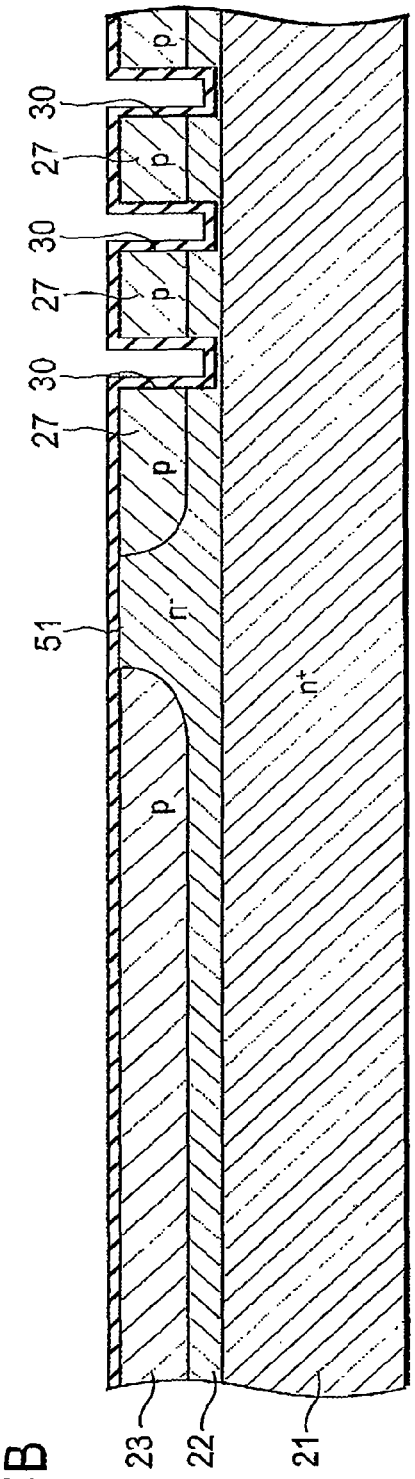
FIG. 5A
FIG. 5B

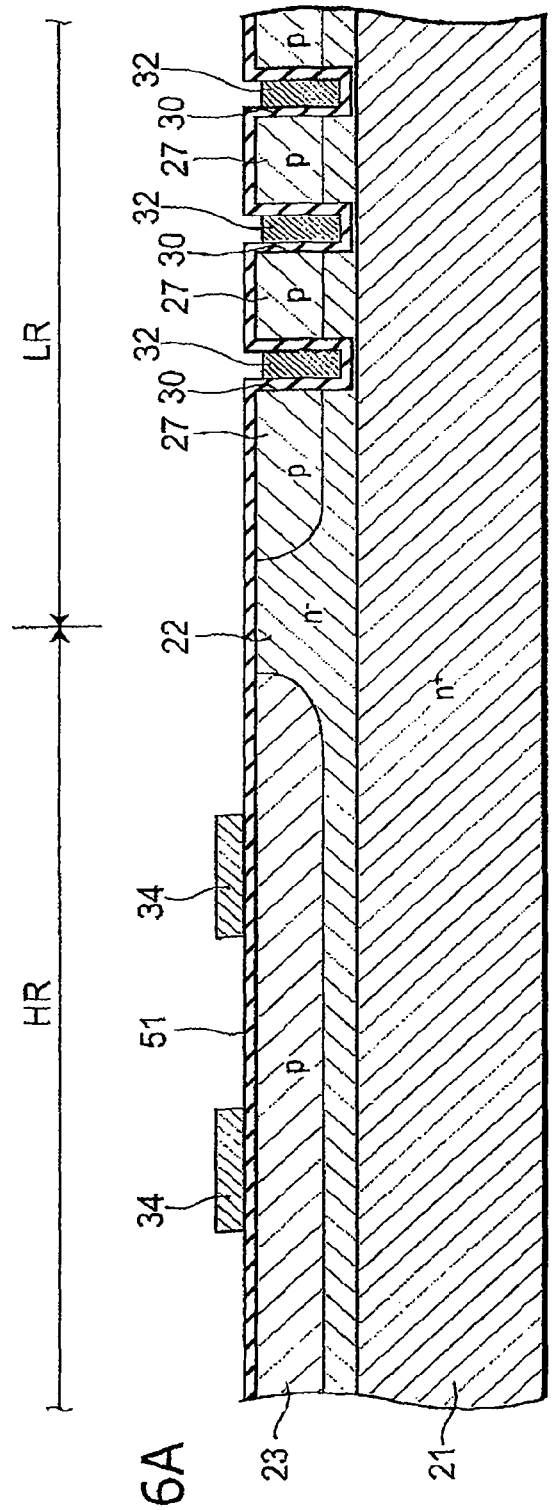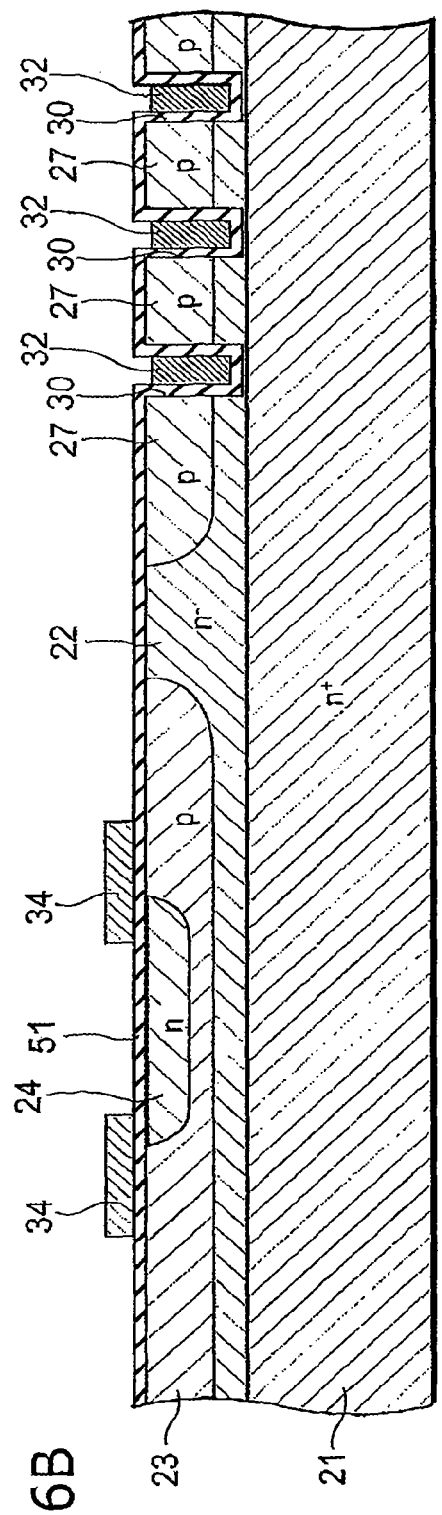

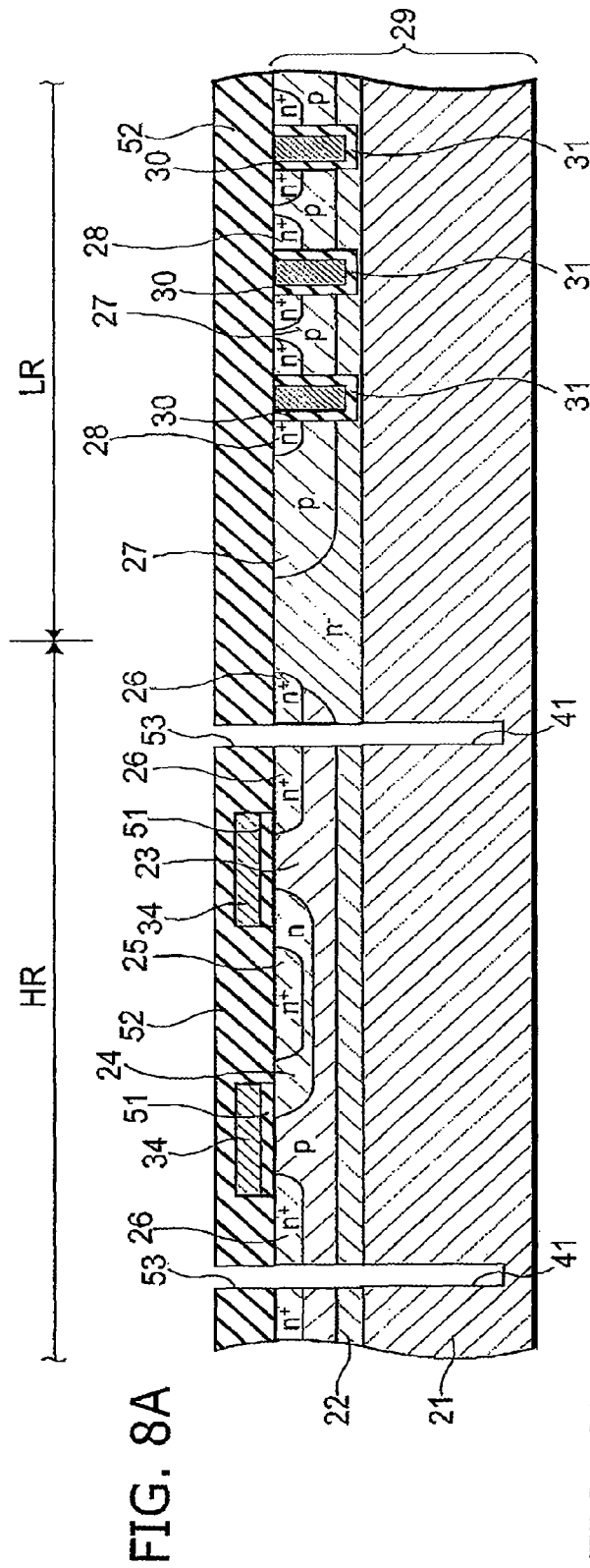
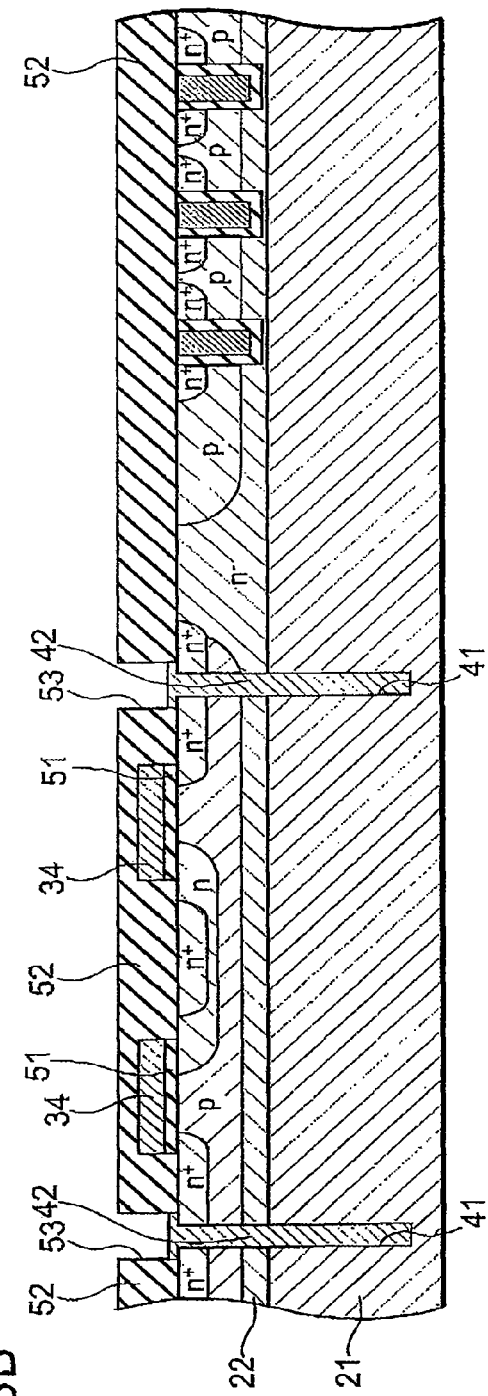
FIG. 8A
FIG. 8B

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2008-008782, filed on Jan. 18, 2008; the entire contents of which are incorporated herein by reference.

BACKGROUND OF THE INVENTION

1. Field of the Invention

This invention relates to a semiconductor device and a method for manufacturing the same, and more particularly to a semiconductor device including both lateral and vertical MOSFET and a method for manufacturing the same.

2. Background Art

In a DC-DC converter, typically, a high-side transistor and a low-side transistor are connected in series between an input potential and a ground potential, and a smoothing circuit composed of an inductor and a capacitor is connected between the junction of these transistors and an output terminal. A control circuit applies a prescribed control signal to the gate electrode of these transistors to produce a given potential at the output terminal.

Recently, there is a demand for downsizing the DC-DC converter to improve the voltage conversion efficiency. For example, JP-A-2005-294464 (Kokai) discloses a technique for housing in one package a semiconductor chip including a high-side transistor, a semiconductor chip including a low-side transistor, and a semiconductor chip including a control circuit. However, in this technique, a plurality of semiconductor chips need to be connected to each other by bonding wires. Thus, there is a limit to the downsizing and efficiency improvement of the DC-DC converter.

To further downsize the DC-DC converter, it may be contemplated to form a high-side transistor and a low-side transistor on the same chip. However, unfortunately, this complicates interconnection and increases interconnect resistance, which contrarily decreases the voltage conversion efficiency (see, e.g., JP-A-9-213956 (Kokai) (1997)).

SUMMARY OF THE INVENTION

According to an aspect of the invention, there is provided a semiconductor device including: a semiconductor substrate; a lateral MOSFET formed in an upper portion of a first region of the semiconductor substrate; a vertical MOSFET formed in a second region of the semiconductor substrate; a backside electrode formed on a lower surface of the semiconductor substrate and connected to a lower region of source/drain regions of the vertical MOSFET; and a connecting member penetrating the semiconductor substrate and connecting one of source/drain regions of the lateral MOSFET to the backside electrode.

According to another aspect of the invention, there is provided a semiconductor device including: a first semiconductor layer of a first conductivity type; a second semiconductor layer of a second conductivity type and a third semiconductor layer of the second conductivity type formed in regions spaced from each other in an upper portion of the first semiconductor layer; a fourth semiconductor layer of the first conductivity type and a fifth semiconductor layer of the first conductivity type formed in regions spaced from each other in an upper portion of the second semiconductor layer; a first electrode provided above the second semiconductor layer and immediately above a region between the fourth semiconductor layer and the fifth semiconductor layer; a sixth semiconductor layer of the first conductivity type formed in part of an upper portion of the third semiconductor layer; a second electrode buried through the sixth semiconductor layer and the third semiconductor layer to the first semiconductor layer and insulated from the sixth semiconductor layer, the third semiconductor layer, and the first semiconductor layer; a backside electrode provided on a lower surface of the first semiconductor layer and connected to the first semiconductor layer; and a connecting member penetrating the first semiconductor layer and connecting the fifth semiconductor layer to the backside electrode.

According to still another aspect of the invention, there is provided a method for manufacturing a semiconductor device, including: forming a lateral MOSFET in an upper portion of a first region of a semiconductor substrate and forming a vertical MOSFET in a second region of the semiconductor substrate; forming a connecting member which penetrates one of source/drain regions of the lateral MOSFET and reaches a depth corresponding to a lower region of source/drain regions of the vertical MOSFET; grinding a lower surface of the semiconductor substrate to expose the connecting member; and forming a backside electrode on the lower surface of the semiconductor substrate, the backside electrode being connected to both the connecting member and the lower region of the vertical MOSFET.

BRIEF DESCRIPTION OF THE DRAWINGS

FIGS. 4A, 4B are process cross-sectional views illustrating a method for manufacturing the semiconductor chip in the first embodiment;

FIGS. 5A, 5B are process cross-sectional views illustrating a method for manufacturing the semiconductor chip in the first embodiment;

FIGS. 6A, 6B are process cross-sectional views illustrating a method for manufacturing the semiconductor chip in the first embodiment;

FIGS. 8A, 8B are process cross-sectional views illustrating a method for manufacturing the semiconductor chip in the first embodiment;

DETAILED DESCRIPTION OF THE INVENTION

Embodiments of the invention will now be described with reference to the drawings, beginning with a first embodiment of the invention.

Figure 1:
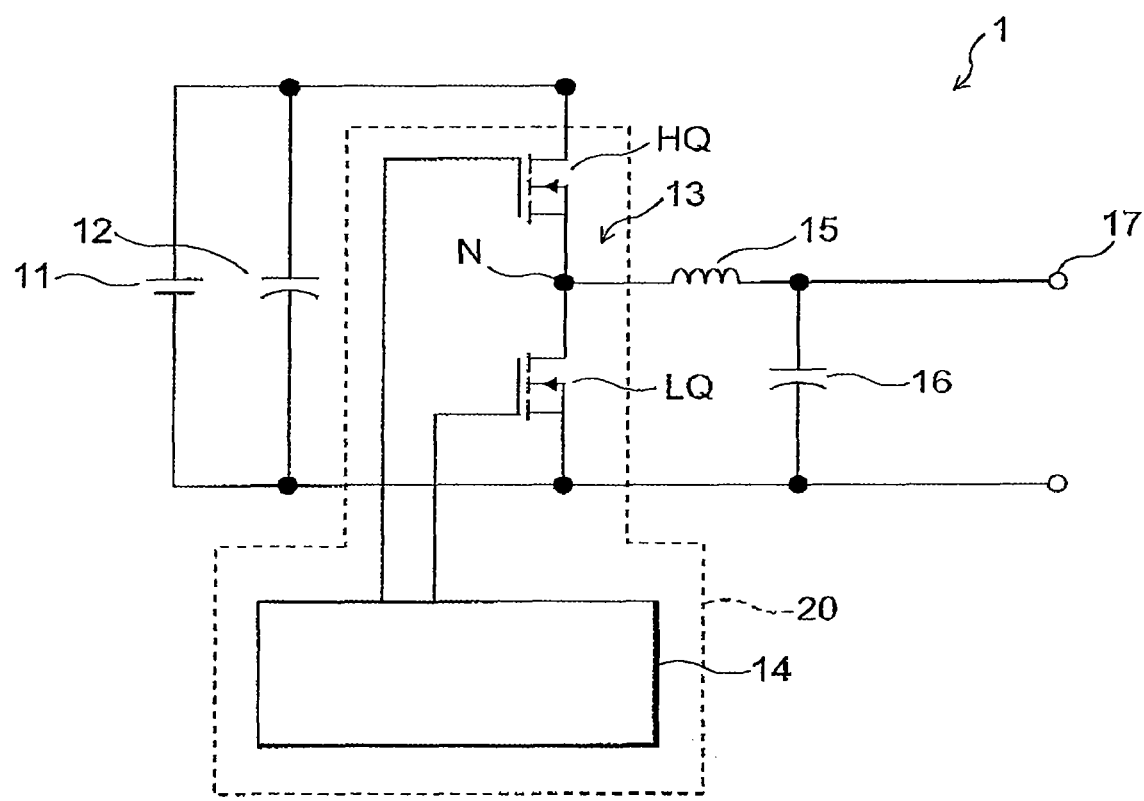
FIG. 1 is a circuit diagram illustrating a DC-DC converter according to a first embodiment of the invention.

FIG. 1 is a circuit diagram illustrating a DC-DC converter according to this embodiment.

Figure 2:
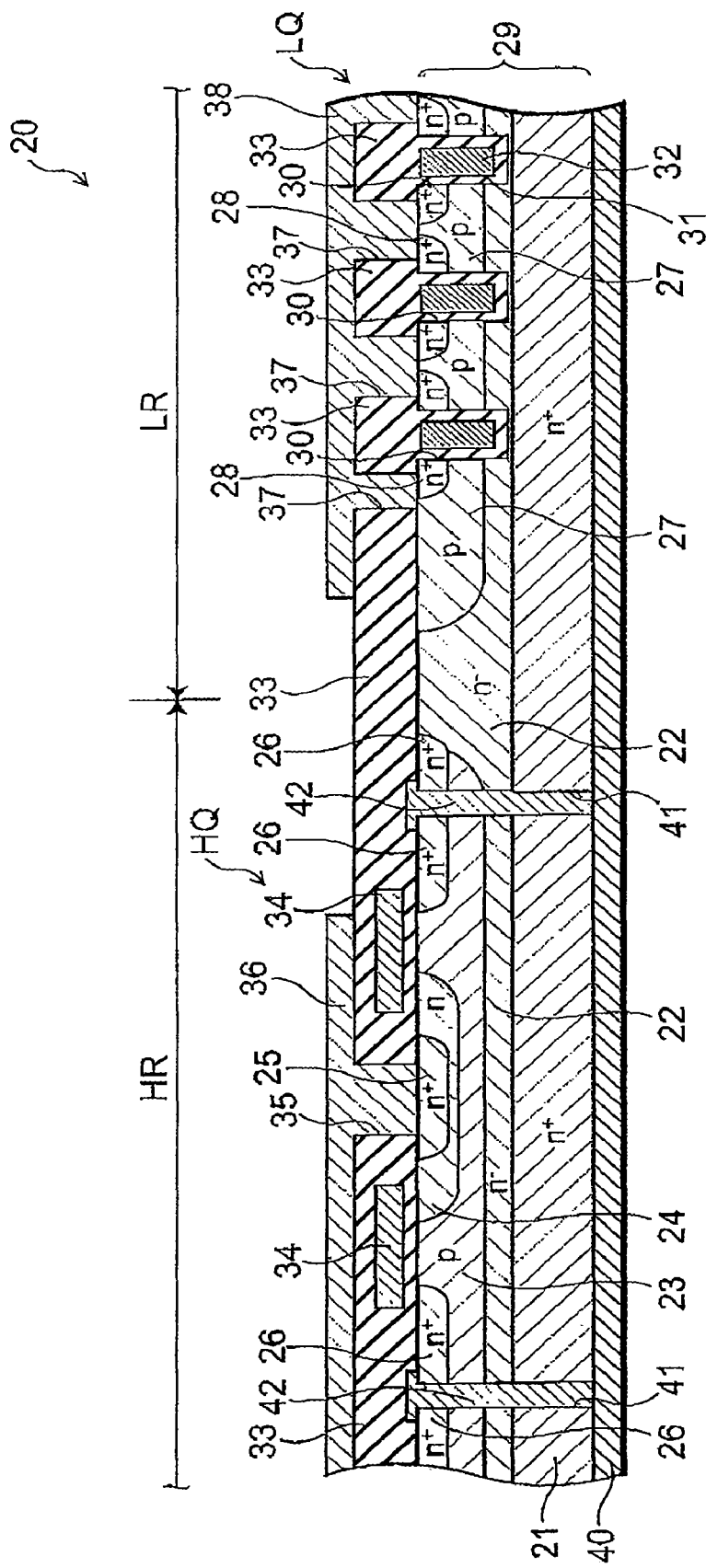
FIG. 2 is a cross-sectional view illustrating a semiconductor chip in the first embodiment.

FIG. 2 is a cross-sectional view illustrating a semiconductor chip in this embodiment.

Figure 3:
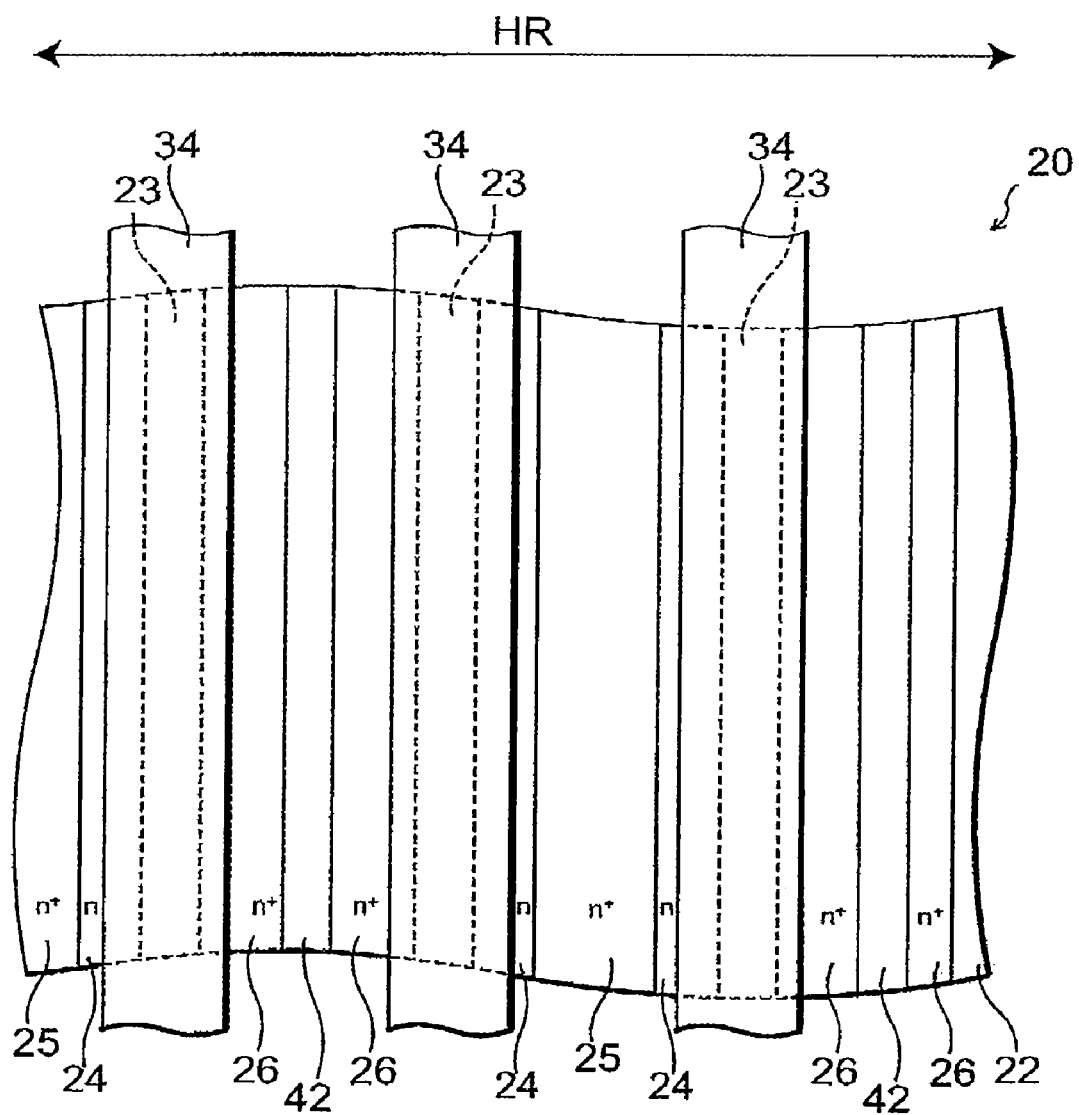
FIG. 3 is a plan view illustrating the high-side transistor region of the semiconductor chip in the first embodiment.

FIG. 3 is a plan view illustrating the high-side transistor region of the semiconductor chip in this embodiment.

In FIG. 3, for clarity of illustration, the insulating film 33, the drain electrode 36, and the source electrode 38 described later are not shown.

As shown in FIG. 1, the semiconductor device according to this embodiment is a DC-DC converter 1 for converting DC voltage to DC voltage. The DC-DC converter 1 includes a power supply 11, a capacitor 12 connected in parallel to the power supply 11, and an output circuit 13 connected in parallel to both the power supply 11 and the capacitor 12. The power supply 11 serves to supply a DC voltage. In the following, the positive electrode potential of the power supply 11 is referred to as an input potential, and the negative electrode potential thereof is referred to as a reference potential. The reference potential is illustratively the ground potential (GND). It is noted that the DC-DC converter 1 may be devoid of the power supply 11, and the input potential and the reference potential may be externally applied thereto.

In the output circuit 13, a high-side transistor HQ made of an N-type MOSFET (metal oxide semiconductor field effect transistor) and a low-side transistor LQ made of an N-type MOSFET are connected in series. More specifically, the input potential is applied to the drain of the high-side transistor HQ, the source of the high-side transistor HQ is connected to the drain of the low-side transistor LQ, and the reference potential is applied to the source of the low-side transistor LQ.

The DC-DC converter 1 further includes a control circuit 14. The control circuit 14 applies control signals having mutually opposite phases to the gate electrode of the high-side transistor HQ and the gate electrode of the low-side transistor LQ to control the on/off of the transistors HQ and LQ. Furthermore, the DC-DC converter 1 includes an LC circuit (smoothing circuit) composed of an inductor 15 and a capacitor 16. One end of the inductor 15 is connected to the junction N of the high-side transistor HQ and the low-side transistor LQ, that is, the source of the high-side transistor HQ and the drain of the low-side transistor LQ. The capacitor 16 is connected between the other end of the inductor 15 and the reference potential. The other end of the inductor 15 is connected to an output terminal 17. The potential difference between the potential of the output terminal 17 and the reference potential represents an output voltage.

The high-side transistor HQ, the low-side transistor LQ, and the control circuit 14 in the DC-DC converter 1 are formed in the same semiconductor chip 20. In the following, the configuration of this semiconductor chip 20 is described.

As shown in FIG. 2, a high-side transistor region HR including the high-side transistor HQ, a low-side transistor region LR including the low-side transistor LQ, and a control circuit region (not shown) including the control circuit 14 are defined in the semiconductor chip 20.

The semiconductor chip 20 includes an $n^+$-type substrate 21 having $n^+$-type conductivity, and an epitaxial layer 22 having $n^-$-type conductivity is formed on the $n^+$-type substrate 21. The $n^+$-type substrate 21 and the epitaxial layer 22 are illustratively formed from single crystal silicon. The thickness of the $n^+$-type substrate 21 is illustratively one hundred and several ten microns, and the thickness of the epitaxial layer 22 is illustratively several microns. The n-type impurity concentration in the epitaxial layer 22 is lower than the n-type impurity concentration in the $n^+$-type substrate 21. The layer composed of the $n^+$-type substrate 21 and the epitaxial layer 22 is referred to as a first semiconductor layer.

In the high-side transistor region HR of the semiconductor chip 20, a p-type well 23 as a second semiconductor layer is formed in the upper portion of the epitaxial layer 22. An n-type region 24 is formed in part of the upper portion of the p-type well 23, and an $n^+$-type region 25 is formed in part of the upper portion of the n-type region 24. The layer composed of the n-type region 24 and the $n^+$-type region 25 is referred to as a fourth semiconductor layer. An $n^+$-type region 26 as a fifth semiconductor layer is formed in another part of the upper portion of the p-type well 23. The n-type region 24 and the $n^+$-type region 26 are formed in separate regions.

As shown in FIG. 3, as viewed from above, the n-type region 24, the $n^+$-type region 25, and the $n^+$-type region 26 are shaped like stripes extending in the same direction, and the $n^+$-type region 25 is placed inside the n-type region 24. The n-type region 24 and the $n^+$-type region 26 are alternately arranged.

On the other hand, in the low-side transistor region LR, a p-type well 27 as a third semiconductor layer is formed in the upper portion of the epitaxial layer 22. This p-type well 27 and the p-type well 23 of the region HR are spaced from each other, and the epitaxial layer 22 intervenes between these wells. An $n^+$-type region 28 as a sixth semiconductor layer is formed in part of the upper portion of the p-type well 27 The $n^+$-type region 28 is shaped like a stripe extending in the same direction as the n-type region 24. The $n^+$-type region 28 is periodically replicated.

In the following, the $n^+$-type substrate 21, the epitaxial layer 22, the p-type well 23, the n-type region 24, the $n^+$-type region 25, the $n^+$-type region 26, the p-type well 27, and the $n^+$-type region 28 are collectively referred to as a semiconductor substrate 29. The upper surface and the lower surface of the semiconductor substrate 29 are effectively flat.

In the region LR in the upper surface of the semiconductor substrate 29, a trench 30 is formed through the $n^+$-type region 28 and the p-type well 27 to the epitaxial layer 22. The trench 30 is shaped like a groove extending in the same direction as the $n^+$-type region 28. A gate insulating film 31 is formed on the inner surface of the trench 30. The gate insulating film 31 is illustratively a silicon oxide film formed by thermal oxidation. A gate electrode 32 illustratively made of polysilicon is formed as a second electrode inside the trench 30. Thus, the gate electrode 32 is buried so as to extend through the $n^+$-type region 28 and the p-type well 27 to the epitaxial layer 22, and is insulated from the $n^+$-type region 28, the p-type well 27, and the epitaxial layer 22 by the gate insulating film 31.

Furthermore, an insulating film 33 is provided on the semiconductor substrate 29. Inside the insulating film 33 in the high-side transistor region HR, a gate electrode 34 illustratively made of polysilicon is formed as a first electrode. The gate electrode 34 is placed above the p-type well 23 in a region that includes the immediately overlying region of the region between the n-type region 24 and the $n^+$-type region 26.

In the high-side transistor region HR, a contact hole 35 illustratively shaped like a groove is formed in the insulating film 33 immediately above the $n^+$-type region 25, and the $n^+$-type region 25 is exposed to the bottom of this contact hole 35. Furthermore, a drain electrode 36 (third electrode) is provided on the insulating film 33. The drain electrode 36 is also buried in the contact hole 35, and thereby connected to the $n^+$-type region 25. The drain electrode 36 is formed from a metal or alloy, illustratively from aluminum.

On the other hand, in the low-side transistor region LR, a contact hole 37 illustratively shaped like a groove is formed in the insulating film 33 immediately above the region between the trenches 30, and the p-type well 27 and the $n^+$-type region 28 are exposed to the bottom of this contact hole 37. Furthermore, a source electrode 38 (fourth electrode) is provided on the insulating film 33. The source electrode 38 is also buried in the contact hole 37, and thereby connected to the p-type well 27 and the $n^+$-type region 28. The source electrode 38 is formed from a metal or alloy, illustratively from aluminum.

In the DC-DC converter 1 according to this embodiment, a backside electrode 40 is provided on the lower surface of the semiconductor substrate 29, that is, on the lower surface of the $n^+$-type substrate 21. The backside electrode 40 is formed from a metal or alloy, illustratively as a laminated electrode in which a vanadium layer, a nickel layer, and a gold layer are laminated in this order. The backside electrode 40 is formed at least on the entire area of the high-side transistor region HR and the low-side transistor region LR, illustratively on the entire area of the lower surface of the semiconductor substrate 29. Thus, the backside electrode 40 is connected to the $n^+$-type substrate 21.

In the high-side transistor region HR, a trench 41 shaped like a stripe is formed through the semiconductor substrate 29, and a connecting member 42 is buried inside the trench 41. Thus, as viewed from above, the connecting member 42 is shaped like a stripe. The connecting member 42 is made of a metal or alloy, such as tungsten, molybdenum, or copper, and extends in the extending direction of the $n^+$-type region 26 from the upper surface side of the semiconductor substrate 29 through the $n^+$-type region 26, the p-type well 23, the epitaxial layer 22, and the $n^+$-type substrate 21 to the backside electrode 40 Thus, the connecting member 42 connects the $n^+$-type region 26 to the backside electrode 40. The inductor 15 is connected to the backside electrode 40.

Next, the operation of the DC-DC converter 1 configured as above is described.

In this embodiment, the input potential is applied to the drain electrode 36, and the reference potential is applied to the source electrode 38. Thus, the $n^+$-type region 25, the n-type region 24, the p-type well 23, the $n^+$-type region 26, the gate electrode 34, and the insulating film 33 constitute a high-side transistor HQ, which is a lateral N-type MOSFET. Furthermore, the $n^+$-type region 28, the p-type well 27, the epitaxial layer 22, the $n^+$-type substrate 21, the gate electrode 32, and the gate insulating film 31 constitute a low-side transistor LQ, which is a vertical N-type MOSFET.

More specifically, the $n^+$-type region 25 and the n-type region 24 (fourth semiconductor layer) serve as a drain region of the high-side transistor HQ, the region of the p-type well 23 (second semiconductor layer) between the n-type region 24 and the $n^+$-type region 26 serves as a channel region, the $n^+$-type region 26 (fifth semiconductor layer) serves as a source region, the gate electrode 34 (first electrode) serves as a gate electrode of the planar type, and the portion of the insulating film 33 between the semiconductor substrate 29 and the gate electrode 34 serves as a gate insulating film. That is, the high-side transistor HQ is formed so that a current is passed in parallel to the upper surface of the semiconductor substrate 29 in the upper portion of the high-side transistor region HR of the semiconductor substrate 29. The source region ($n^+$-type region 26) is connected to the backside electrode 40 through the connecting member 42.

Furthermore, the $n^+$-type region 28 (sixth semiconductor layer) serves as a source region of the low-side transistor LQ, the p-type well 27 (third semiconductor layer) serves as a channel region, the epitaxial layer 22 and the $n^+$-type substrate 21 (first semiconductor layer) serve as a drain region, the gate electrode 32 (second electrode) serves as a gate electrode of the trench type, and the gate insulating film 31 serves as a gate insulating film. That is, the low-side transistor LQ is formed so that a current is passed in the thickness direction of the semiconductor substrate 29 throughout the thickness of the semiconductor substrate 29 in the low-side transistor region LR of the semiconductor substrate 29. The drain region (epitaxial layer 22 and $n^+$-type substrate 21) is connected to the backside electrode 40.

Consequently, in the semiconductor chip 20 is formed an output circuit 13 (see FIG. 1), in which the drain electrode 36, $n^+$-type region 25, n-type region 24 (drain region), p-type well 23 (channel region), $n^+$-type region 26 (source region), connecting member 42, backside electrode 40, $n^+$-type substrate 21, epitaxial layer 22 (drain region), p-type well 27 (channel region), $n^+$-type region 28 (source region), and source electrode 38 are arranged in series in this order. Here, the backside electrode 40 corresponds to the junction N.

By thus configuring the DC-DC converter 1, the drain electrode 36 and the source electrode 38 can be each formed as a single electrode. Hence, there is no need for downscaling to provide a plurality of drain electrodes 36 and source electrodes 38, and there is also no need for interconnection to integrate the downscaled electrodes. Consequently, interconnect resistance in the drain electrode 36 and the source electrode 38 is reduced.

Next, the effect of this embodiment is described.

As described above, according to this embodiment, by forming each of the drain electrode 36 and the source electrode 38 as a single electrode, interconnect resistance is reduced, and the voltage conversion efficiency of the DC-DC converter 1 can be improved. Furthermore, the DC-DC converter 1 can be downsized. Moreover, because the distance between the source region of the high-side transistor HQ and the drain region of the low-side transistor LQ is extremely short, the parasitic inductance can be reduced, and the voltage conversion efficiency of the DC-DC converter 1 can be further improved. Furthermore, because the high-side transistor HQ, the low-side transistor LQ, and the control circuit 14 can be formed in the same semiconductor chip 20, the assembly cost is also reduced.

In contrast, if the transistors HQ and LQ are formed from the conventional lateral MOSFET, the drain electrode and the source electrode are alternately arranged on the semiconductor substrate. Hence, each electrode becomes finer and has an increased resistance. Furthermore, to connect these fine electrodes to the outside of the semiconductor chip, the electrodes need to be integrated by providing a plurality of interconnect layers on the semiconductor substrate. This interconnect layer also increases the interconnect resistance. On the other hand, it may be also contemplated to form the transistors HQ and LQ from the conventional vertical MOSFET. However, in this configuration, the parasitic capacitance between the gate electrode and the drain electrode deteriorates the high-frequency characteristics of the high-side transistor HQ. Furthermore, this configuration needs an interconnect for connecting the source region of the high-side transistor HQ to the drain region of the low-side transistor LQ and increases interconnect resistance.

Next, a method for manufacturing the DC-DC converter 1 is described.

FIGS. 4A, 4B, 5A, 5B, 6A, 6B, 7A, 7B, 8A, 8B, 9A, 9B, and 10 are process cross-sectional views illustrating the method for manufacturing the semiconductor chip 20 in this embodiment.

As shown in FIG. 4A, an $n^+$-type substrate 21 is prepared The thickness of the $n^+$-type substrate 21 is illustratively 600 microns. Next, an epitaxial layer 22 having $n^-$-type conductivity is formed on the $n^+$-type substrate 21. The thickness of the epitaxial layer 22 is illustratively several microns. In the $n^+$-type substrate 21 and the epitaxial layer 22, the elements constituting the high-side transistor HQ, the low-side transistor LQ, and the control circuit 14 (see FIG. 1) are formed. In the following, only the method for fabricating the transistors HQ and LQ is described. However, the elements constituting the control circuit 14 are simultaneously formed.

First, as shown in FIG. 4B, the upper portion of the epitaxial layer 22 is selectively doped with an impurity serving as an acceptor to form a p-type well 23 in the high-side transistor region HR and a p-type well 27 in the low-side transistor region LR. At this time, the p-type well 23 and the p-type well 27 are formed so as to be spaced from each other.

Next, as shown in FIG. 5A, in the low-side transistor region LR, a plurality of trenches 30 are formed from the upside. The trench 30 is shaped like a groove extending in one direction. The depth of the trench 30 is such that the trench 30 penetrates the p-type well 27 and reaches the epitaxial layer 22. It is noted that the sequence of forming the p-type wells 23 and 27 shown in FIG. 4B and forming the trenches 30 shown in FIG. 5A may be reversed. Next, as shown in FIG. 5B, a thermal oxide film 51 is formed entirely on the upper surface of the epitaxial layer 22.

Next, as shown in FIG. 6A, a conductive film illustratively made of polysilicon is formed entirely on the epitaxial layer 22, and then patterned by selective removal. Thus, a plurality of gate electrodes 34 are formed in the high-side transistor region HR, and a gate electrode 32 is buried in the trenches 30 of the low-side transistor region LR. Next, as shown in FIG. 6B, the p-type well 23 is selectively doped with an impurity serving as a donor, and then diffused to form an n-type region 24 in part of the upper portion of the p-type well 23.

Figure 7A:
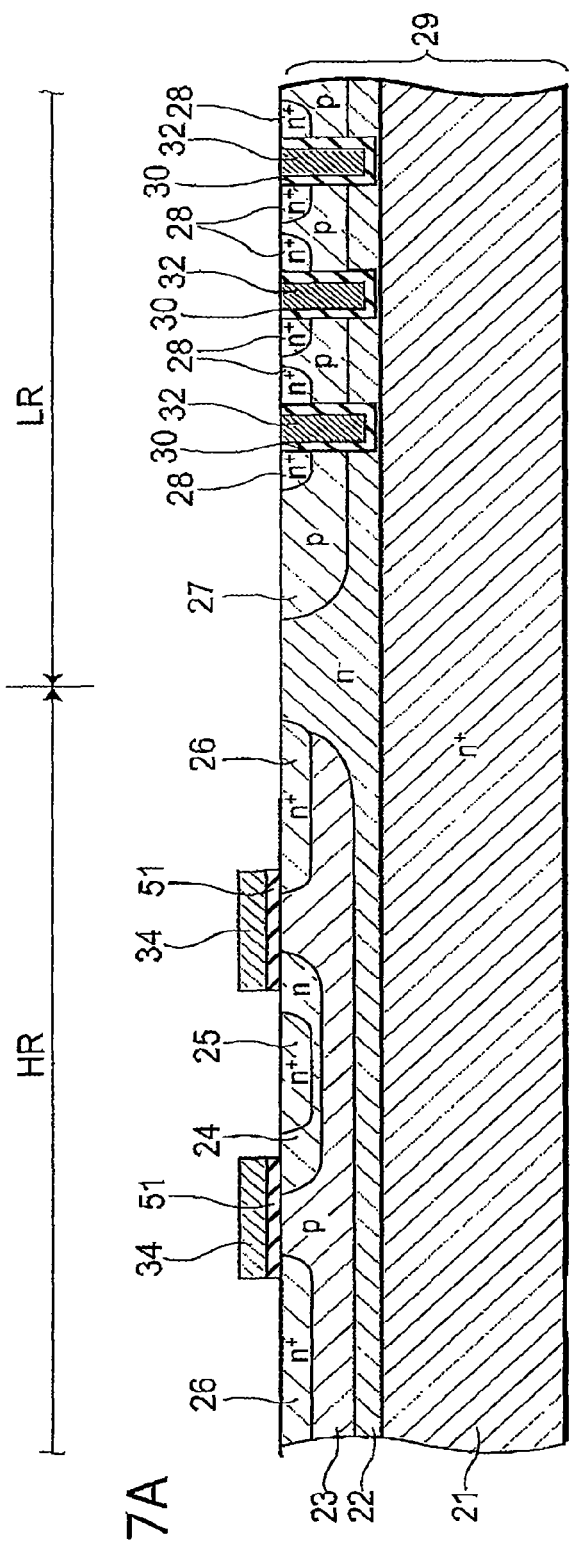
FIGS. 7A, 7B are process cross-sectional views illustrating a method for manufacturing the semiconductor chip in the first embodiment.

Next, as shown in FIG. 7A, the p-type well 23 and the p-type well 27 are selectively doped with an impurity serving as a donor, and then diffused. Thus, an $n^+$-type region 25 is formed in part of the upper portion of the n-type region 24, an $n^+$-type region 26 is formed outside the n-type region 24 in the upper portion of the p-type well 23, and an $n^+$-type region 28 is formed in a region in contact with the trench 30 in the upper portion of the p-type well 27. As a result, the semiconductor substrate 29 is fabricated. Subsequently, the thermal oxide film 51 is removed. At this time, the thermal oxide film 51 is left inside the trench 30 and immediately below the gate electrode 34, each serving as a gate insulating film. Thus, a high-side transistor HQ, which is a lateral MOSFET, is formed in the upper portion of the high-side transistor region HR of the semiconductor substrate 29, and a low-side transistor LQ, which is a vertical MOSFET, is formed throughout the thickness of the semiconductor substrate 29 in the low-side transistor region LR.

Figure 7B:
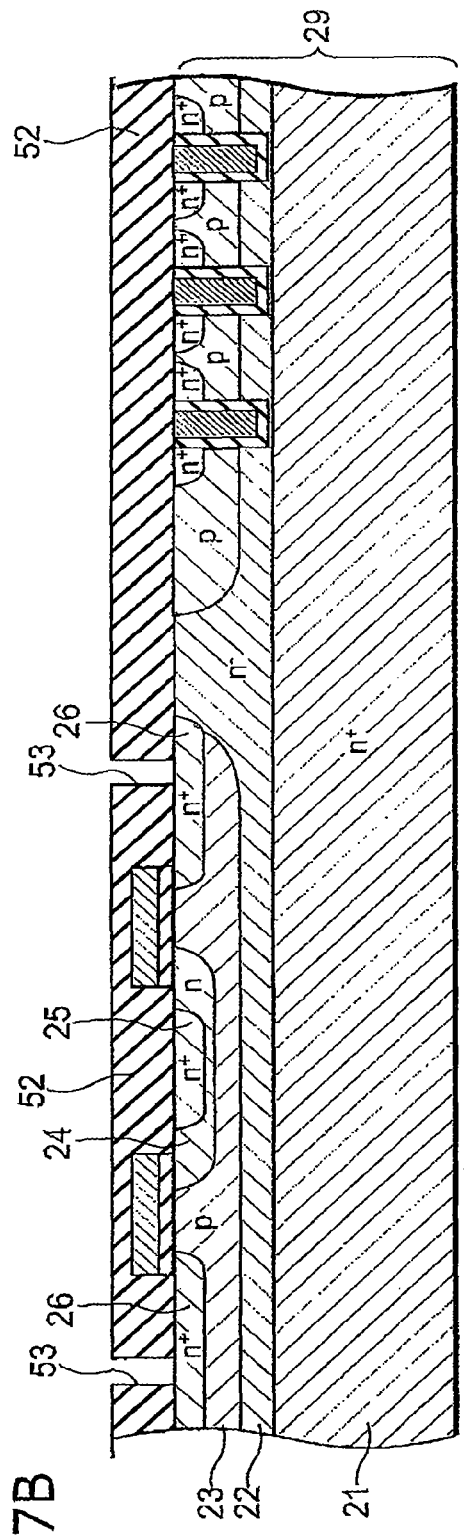

Next, as shown in FIG. 7B, an insulating film 52 is formed on the semiconductor substrate 29 so as to cover the gate electrode 34. Then, an opening 53 shaped like a groove is formed in part of the immediately overlying region of the $n^+$-type region 26 in the insulating film 52. The width of the opening 53 is illustratively 0.5 to several microns.

Next, as shown in FIG. 8A, the insulating film 52 is used as a mask to perform RIE (reactive ion etching) to form a trench 41 in the semiconductor substrate 29 immediately below the opening 53. The depth of the trench 41 is such that the trench 41 penetrates the $n^+$-type region 26, the p-type well 23, and the epitaxial layer 22 and reaches inside the $n^+$-type substrate 21. For example, the depth of the trench 41 is several microns to one hundred and several ten microns.

Next, as shown in FIG. 8B, the opening 53 of the insulating film 52 is expanded, and a conductive material is buried inside the trench 41. The conductive material is a metal or alloy, such as tungsten, molybdenum, or copper. Thus, in the trench 41 is buried a connecting member 42, which reaches the depth corresponding to the drain region of the low-side transistor LQ. At this time, the upper end portion of the connecting member 42 is connected to the $n^+$-type region 26.

Figure 9A:
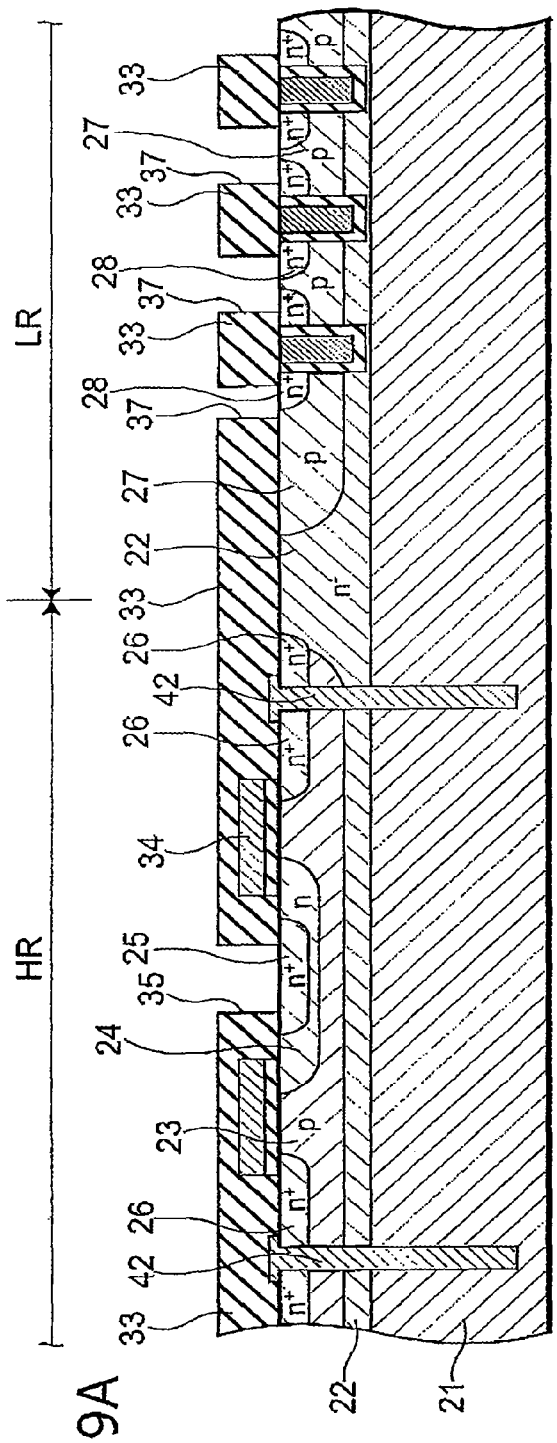
FIGS. 9A, 9B are process cross-sectional views illustrating a method for manufacturing the semiconductor chip in the first embodiment.

Next, as shown in FIG. 9A, the insulating film 52 (see FIG. 8B) is removed, and an insulating film 33 is newly formed. At this time, the thermal oxide film 51 immediately below the gate electrode 34 is integrated with the insulating film 33, and the gate electrode 34 is insulated from the surroundings by the insulating film 33. Next, the insulating film 33 is selectively removed to form a contact hole 35 illustratively shaped like a groove in part of the immediately overlying region of the $n^+$-type region 25 in the insulating film 33, and to form a contact hole 37 illustratively shaped like a groove immediately above the region including the boundary between the p-type well 27 and the $n^+$-type region 28.

Figure 9B:
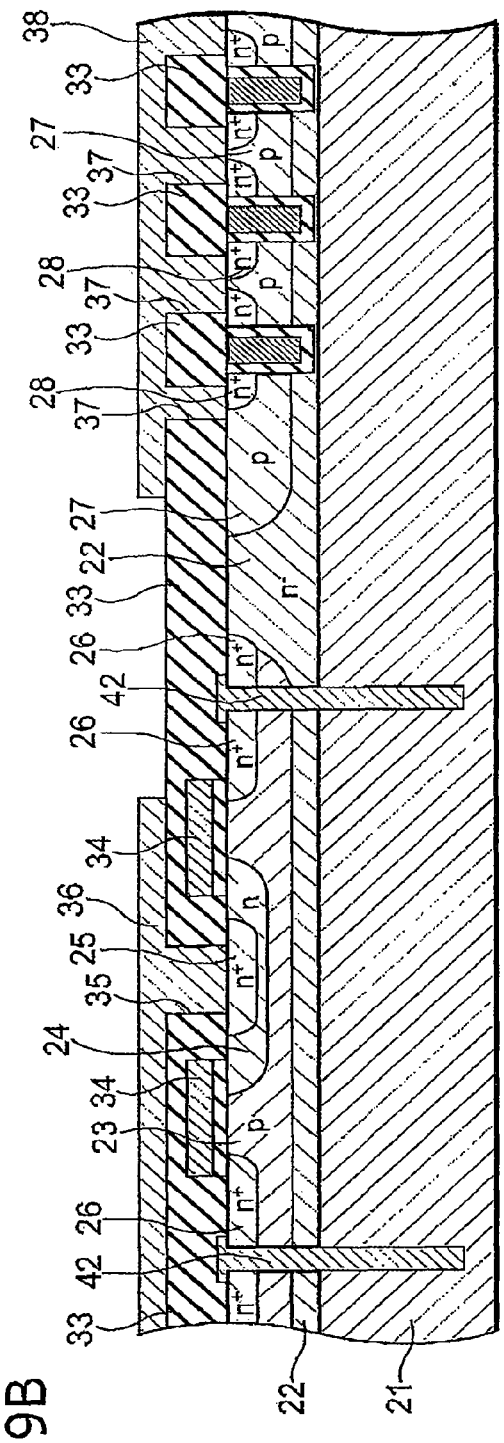

Next, as shown in FIG. 9B, a conductive film illustratively made of aluminum is formed entirely on the insulating film 33, and then patterned by selective removal. Thus, a single drain electrode 36 is formed in the high-side transistor region HR, and a single source electrode 38 is formed in the low-side transistor region LR. At this time, the drain electrode 36 is connected to the $n^+$-type region 25 through the contact hole 35, and the source electrode 38 is connected to the p-type well 27 and the $n^+$-type region 28 through the contact hole 37.

Figure 10:
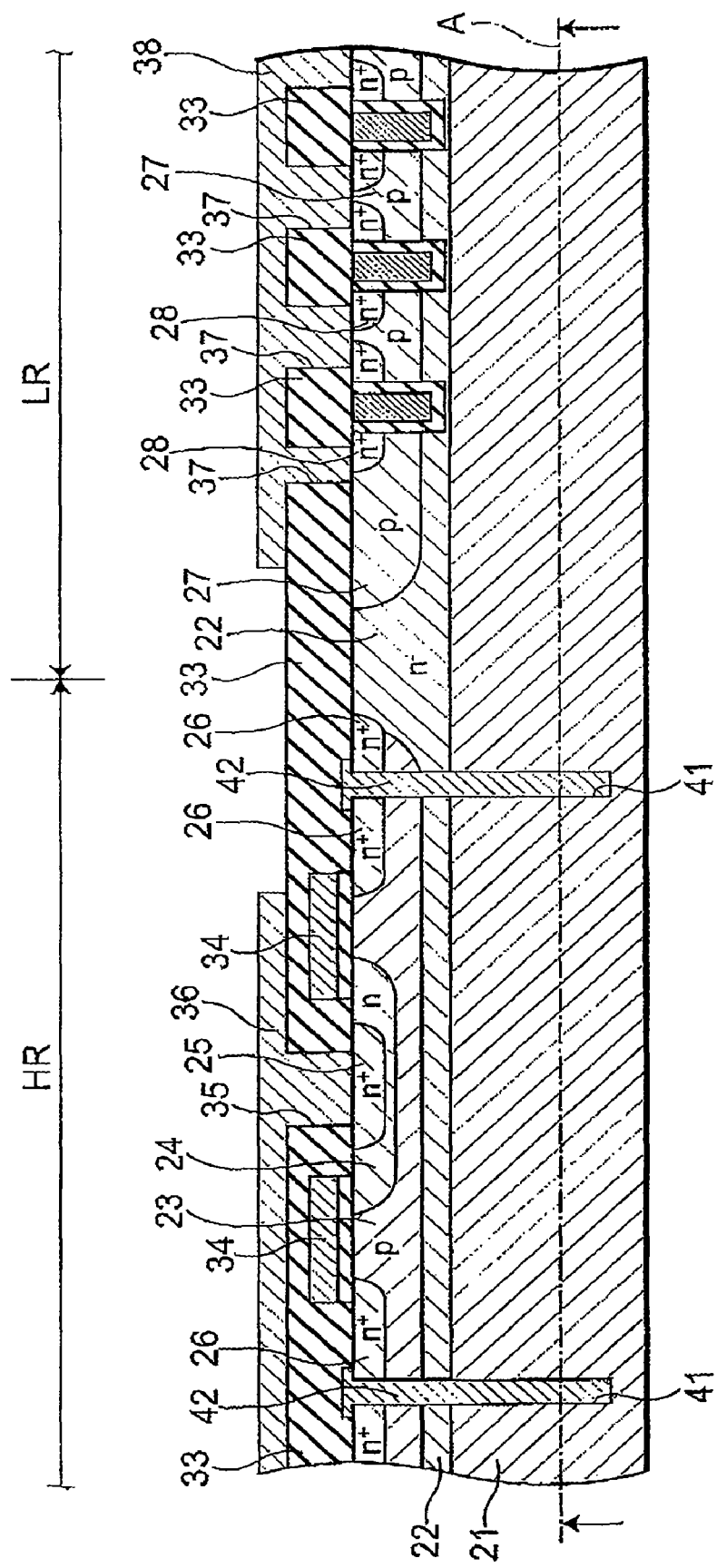
FIG. 10 is a process cross-sectional view illustrating a method for manufacturing the semiconductor chip in the first embodiment.

Next, as shown in FIG. 10, the upper surface of the semiconductor substrate 29 is protected by being coated with a protective film such as a wax (not shown). Then, the $n^+$-type substrate 21 is ground from the lower surface side to the position indicated by line A. Thus, the connecting member 42 is exposed to the lower surface of the $n^+$-type substrate 21. After being ground, the $n^+$-type substrate 21 preferably has the smallest possible thickness as long as it can maintain adequate mechanical strength, and the thickness is illustratively several microns to one hundred and several ten microns. It is noted that this grinding may be a rough grinding because no element is formed on the lower surface of the $n^+$-type substrate 21.

Next, as shown in FIG. 2, a vanadium layer, a nickel layer, and a gold layer, for example, are deposited in this order on the lower surface of the $n^+$-type substrate 21 to form a backside electrode 40 as a laminated electrode. The backside electrode 40 is connected to both the lower end of the connecting member 42 and the $n^+$-type substrate 21. Thus, the semiconductor chip 20 is formed. As described above, the high-side transistor HQ, the low-side transistor LQ, and the control circuit 14 have been formed in the semiconductor chip 20.

Then, as shown in FIG. 1, the positive electrode of a power supply 11 is connected to the drain electrode 36 of the semiconductor chip 20, which corresponds to the positive electrode terminal of the output circuit 13, and the negative electrode of the power supply 11 is connected to the source electrode 38, which corresponds to the negative electrode terminal of the output circuit 13. Furthermore, a capacitor 12 is connected between the drain electrode 36 and the source electrode 38. Moreover, an inductor 15 is connected to the backside electrode 40, and a capacitor 16 is connected between the inductor 15 and the reference potential. Thus, the DC-DC converter 1 is manufactured.

Thus, according to this embodiment, a DC-DC converter 1 can be manufactured in which a high-side transistor HQ and a low-side transistor LQ are integrated in a single semiconductor chip 20. Furthermore, according to this embodiment, because the high-side transistor HQ and the low-side transistor LQ can be simultaneously formed, the manufacturing cost is low.

Next, a first variation of the first embodiment is described.

Figure 11:
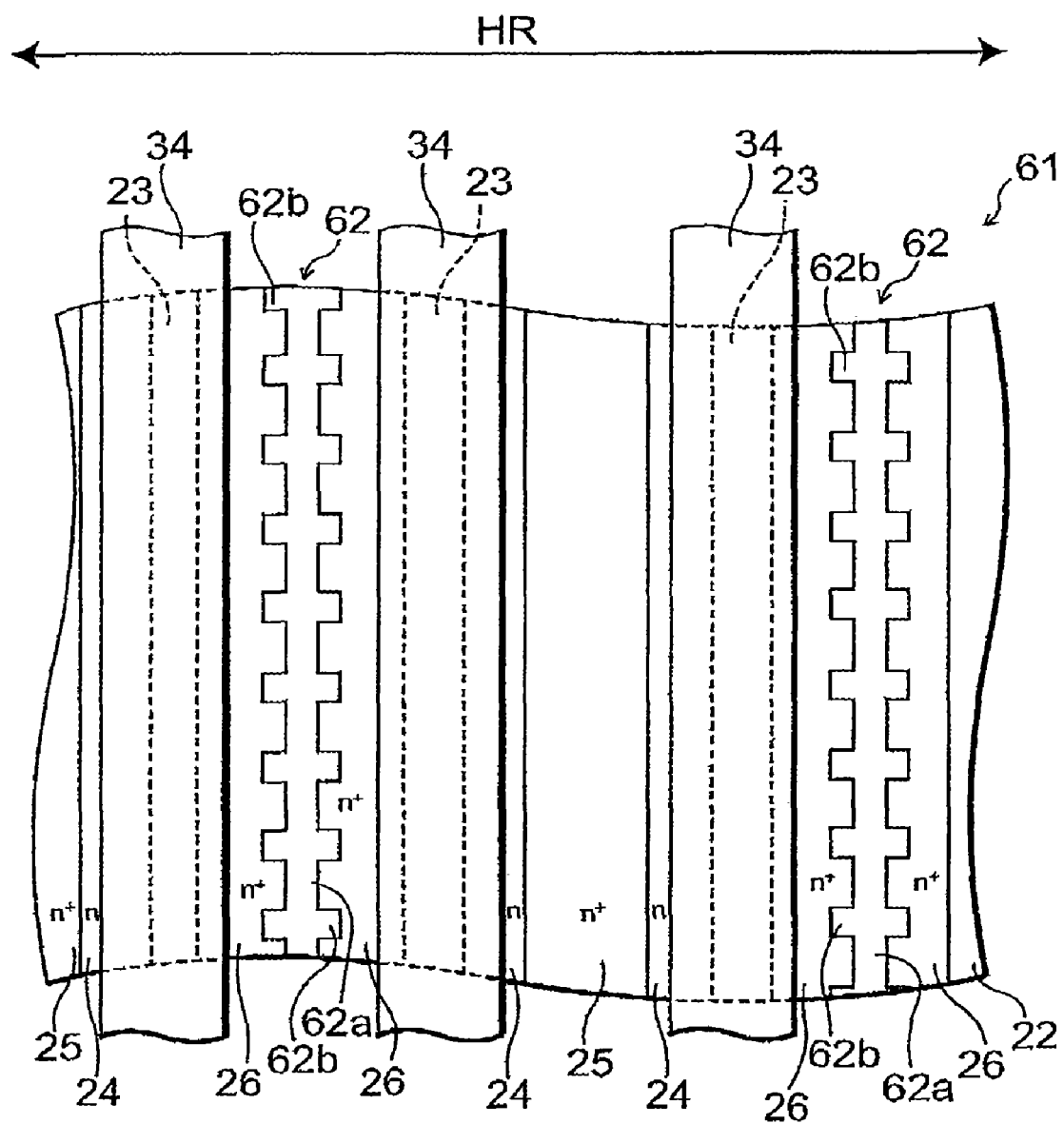
FIG. 11 is a plan view illustrating the high-side transistor region of a semiconductor chip in a first variation of the first embodiment.

FIG. 11 is a plan view illustrating the high-side transistor region of the semiconductor chip in this variation.

In FIG. 11, for clarity of illustration, the insulating film 33, the drain electrode 36, and the source electrode 38 are not shown. The same applies to FIGS. 12 to 14 described later.

As shown in FIG. 11, in the semiconductor chip 61 of this variation, the shape of the connecting member 62 is different from the shape of the connecting member 42 in the above first embodiment. More specifically, the connecting member 62 of this variation includes a trunk portion 62a extending in one direction and a branch portion 62b extending in a direction crossing the trunk portion 62a, e.g., extending orthogonal thereto. A plurality of branch portions 62b are provided and periodically arranged along the extending direction of the trunk portion 62a.

According to this variation, by providing the branch portions 62b in the connecting member 62, the contact area between the connecting member 62 and the backside electrode 40 (see FIG. 2) can be increased. Thus, the resistance between the high-side transistor HQ and the low-side transistor LQ can be further reduced. The configuration, operation, and effect other than the foregoing in this variation are the same as those in the above first embodiment.

Next, a second variation of the first embodiment is described.

Figure 12:
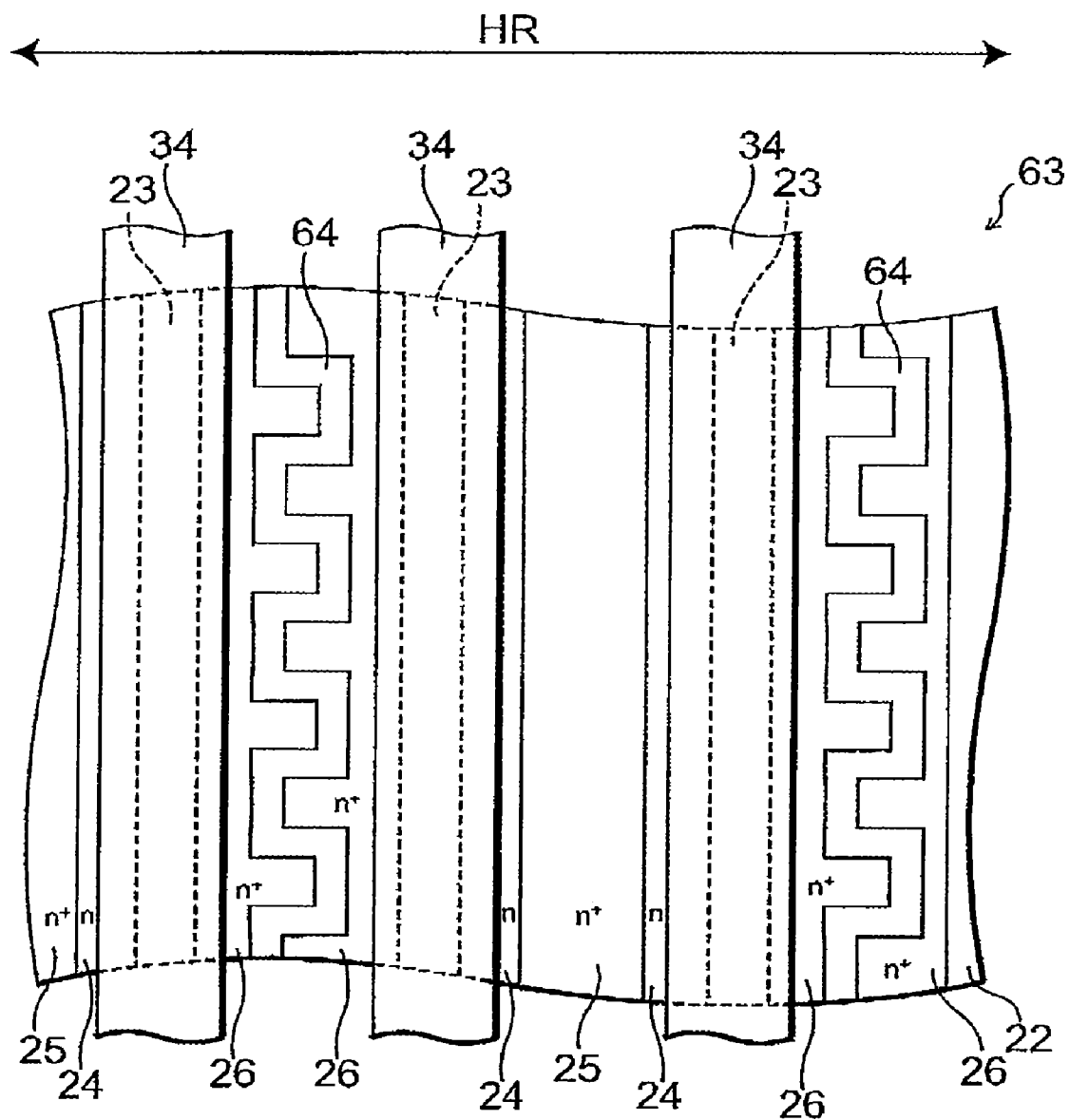
FIG. 12 is a plan view illustrating the high-side transistor region of a semiconductor chip in a second variation of the first embodiment.

FIG. 12 is a plan view illustrating the high-side transistor region of the semiconductor chip in this variation.

As shown in FIG. 12, in the semiconductor chip 63 of this variation, as viewed from above, the connecting member 64 extends in one direction while meandering. Thus, the contact area between the connecting member 64 and the backside electrode 40 (see FIG. 2) can be increased, and the resistance between the high-side transistor HQ and the low-side transistor LQ can be further reduced. The configuration, operation, and effect other than the foregoing in this variation are the same as those in the above first embodiment.

Next, a third variation of the first embodiment is described.

Figure 13:
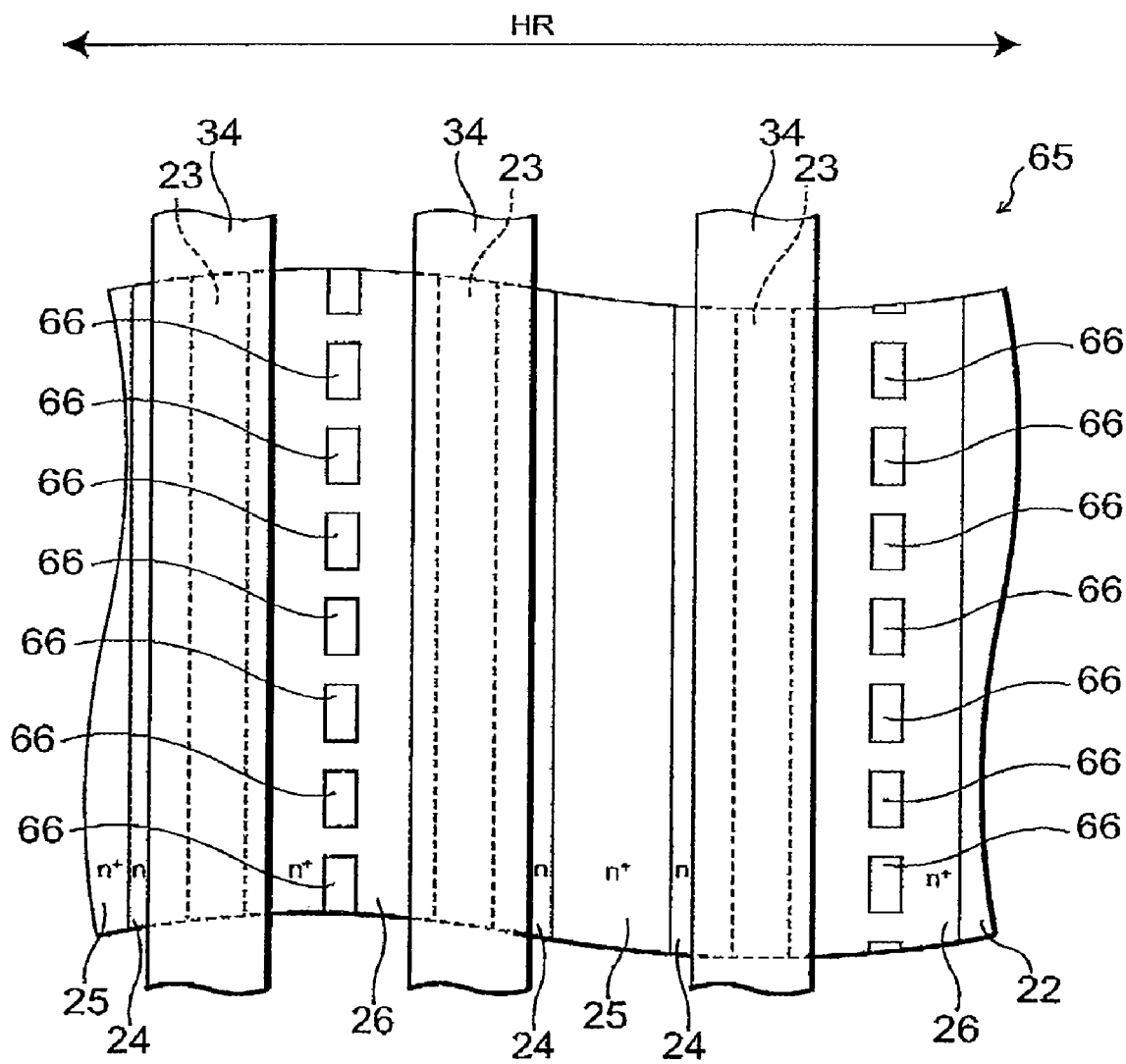
FIG. 13 is a plan view illustrating the high-side transistor region of a semiconductor chip in a third variation of the first embodiment.

FIG. 13 is a plan view illustrating the high-side transistor region of the semiconductor chip in this variation.

As shown in FIG. 13, in the semiconductor chip 65 of this variation, connecting members 66 are formed intermittently. That is, as viewed from above, the connecting members 66 are shaped collectively like a dashed line. The configuration, operation, and effect other than the foregoing in this variation are the same as those in the above first embodiment.

It is noted that the shape of each connecting member 66 as viewed from above is not limited to a rectangle, but may be illustratively a circle.

Next, a second embodiment of the invention is described.

Figure 14:
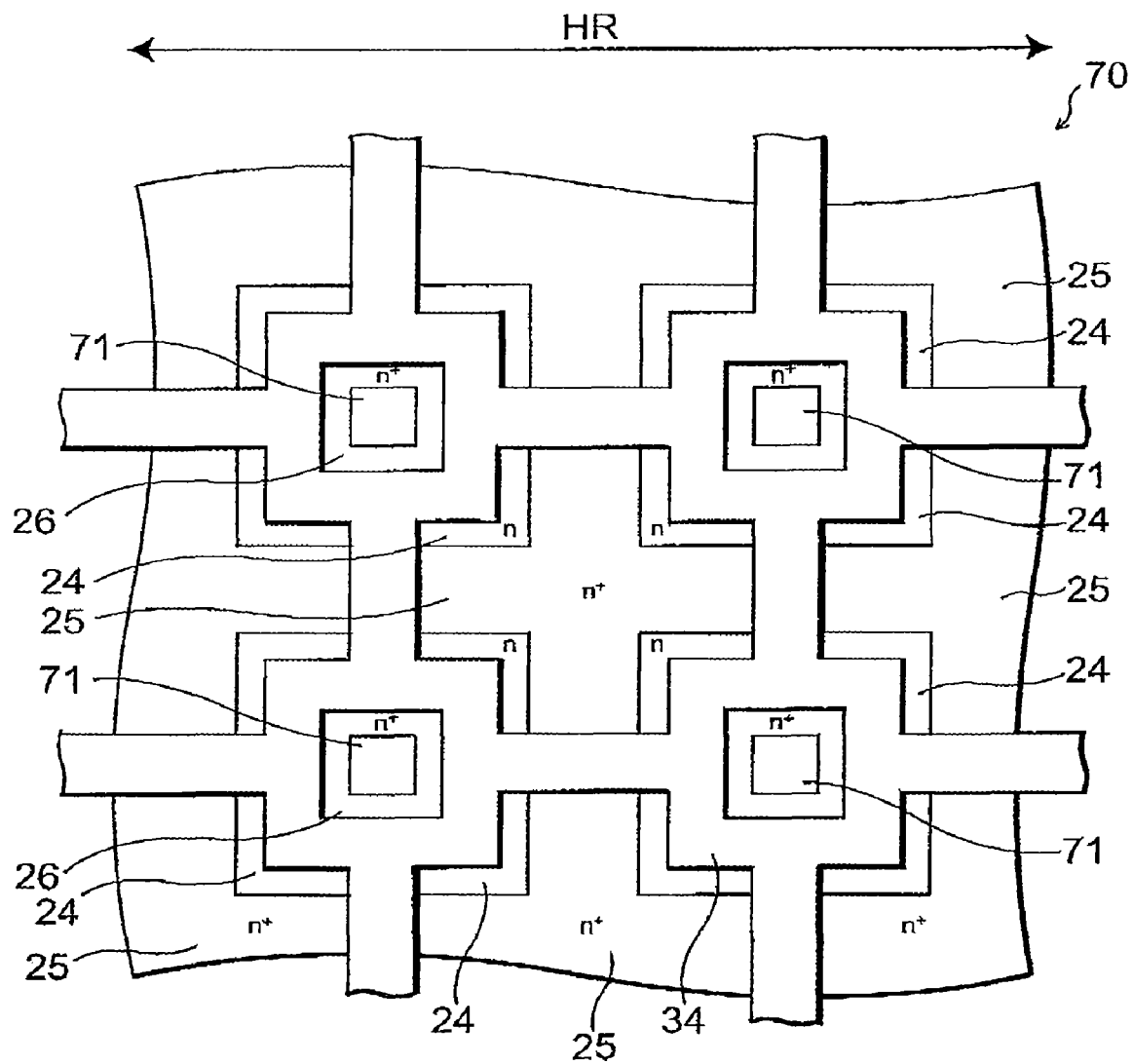
FIG. 14 is a plan view illustrating the high-side transistor region of a semiconductor chip in a second embodiment of the invention.

FIG. 14 is a plan view illustrating the high-side transistor region of the semiconductor chip in this embodiment.

As shown in FIG. 14, in the semiconductor chip 70 of this embodiment, as viewed from above, a plurality of connecting members 71 are formed in a matrix configuration. An $n^+$-type region 26 serving as a source region is formed like a frame around each connecting member 71, a p-type well 23 (see FIG. 2) serving as a channel region is exposed like a frame therearound, and an n-type region 24 serving as a drain region is formed like a frame therearound. Furthermore, the lattice-like region between the n-type regions 24 surrounding the respective connecting members 71 serves as an $n^+$-type region 25. A gate electrode 34 is disposed in the immediately overlying region of the p-type well 23 and in a region connecting between these immediately overlying regions. Hence, as viewed from above, the gate electrode 34 is shaped so that a plurality of frames arranged in a matrix configuration are bridged together.

According to this embodiment, by the above layout, the area of the channel region is increased, and the on-resistance can be reduced. The configuration, operation, and effect other than the foregoing in this embodiment are the same as those in the above first embodiment.

Next, a third embodiment of the invention is described.

Figure 15:
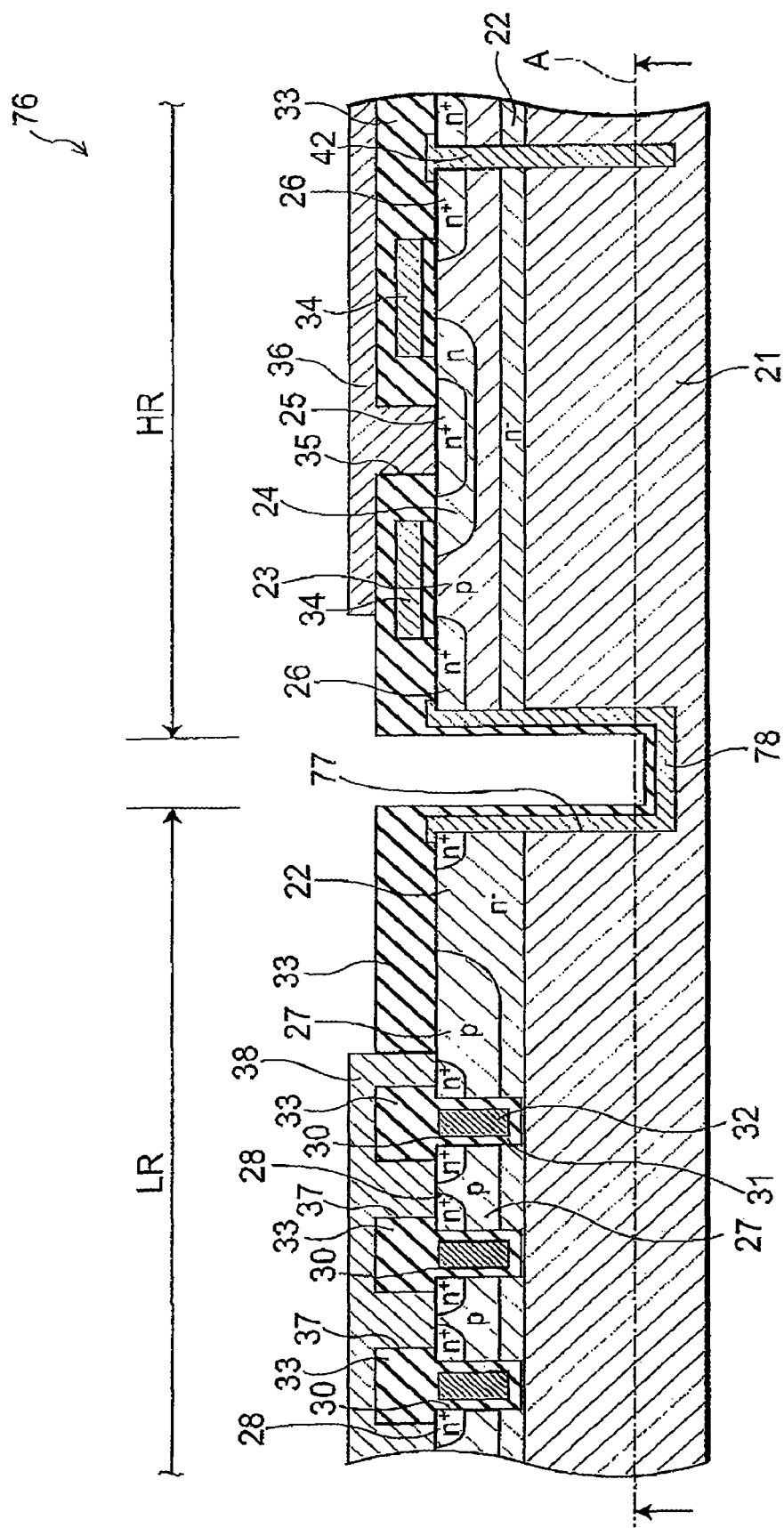
FIG. 15 is a process cross-sectional view illustrating a method for manufacturing a semiconductor chip in a third embodiment of the invention.

FIG. 15 is a process cross-sectional view illustrating a method for manufacturing a semiconductor chip in this embodiment.

FIG. 15 shows the periphery of the region intended for the terminal portion of the chip in the wafer.

As shown in FIG. 15, in the semiconductor chip 76 of this embodiment, when the opening 53 is formed in the insulating film 52 in the process shown in FIG. 7B, an opening (not shown) shaped like a groove is formed also in the region intended for the terminal portion of the chip. The width of this opening is made wider than the width of the opening 53.

Thus, when the trench 41 is formed in the process shown in FIG. 8A, a trench 77 having a wider width than the trench 41 is formed in the region intended for the terminal portion. As described later, the trench 77 is a chip dividing trench. Furthermore, when a conductive material such as tungsten is buried in the trench 41 in the process shown in FIG. 8B, a conductive film 78 is formed on the inner surface of the trench 77. At this time, a gap is left between the side surfaces of the trench 77 rather than completely filling the conductive material inside the trench 77. Furthermore, when the insulating film 33 is formed in the process shown in FIG. 9A, the conductive film 78 is covered with the insulating film 33. Then, as shown in FIG. 15, when the $n^+$-type substrate 21 is ground from the lower surface side, the wafer is divided into a plurality of semiconductor chips 76 by the trench 77. At this time, the inner surface of the trench 77 serves as a terminal surface of the semiconductor chip 76, and this terminal surface is covered with the conductive film 78 and the insulating film 33. The conductive film 78 provided on the high-side transistor region HR side serves also as a connecting member.

According to this embodiment, one wafer can be divided into a plurality of semiconductor chips 70 simply by forming an additional opening when the opening 53 is formed in the insulating film 52 in the process shown in FIG. 7B. Thus, the dicing process can be omitted. The method for manufacturing a semiconductor chip and the configuration, operation, and effect of the DC-DC converter other than the foregoing in this embodiment are the same as those in the above first embodiment.

Next, a fourth embodiment of the invention is described.

Figure 16:
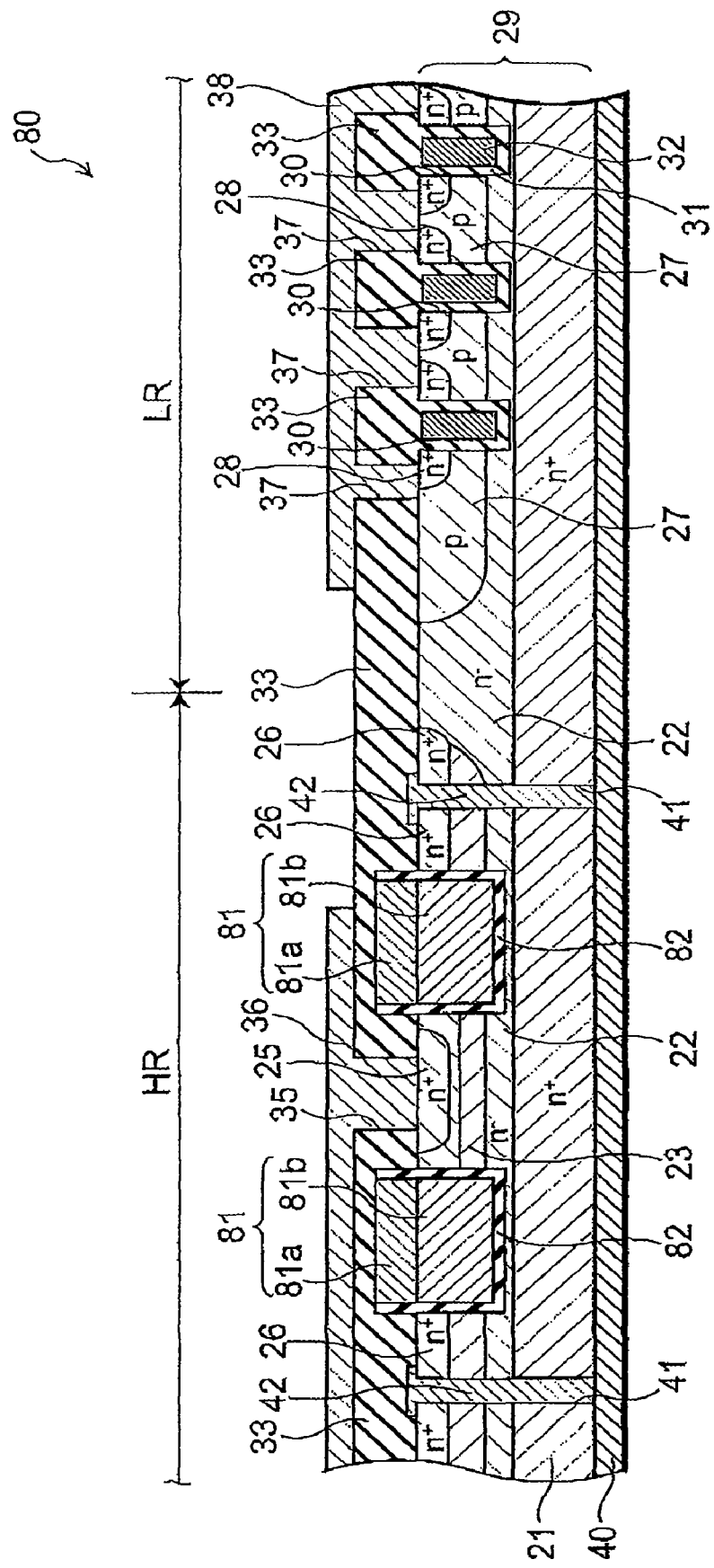
FIG. 16 is a cross-sectional view illustrating a semiconductor chip in a fourth embodiment of the invention.

FIG. 16 is a cross-sectional view illustrating a semiconductor chip in this embodiment.

As shown in FIG. 16, the semiconductor chip 80 of this embodiment is different from the semiconductor chip 20 (see FIG. 2) of the above first embodiment in that the gate electrode 34 (see FIG. 2) of the planar type is replaced by a gate electrode 81 of the trench type. The gate electrode 81 is shaped like a comb and made of a connecting portion 81a shaped like a stripe disposed on the semiconductor substrate 29 and a buried portion 81b buried in the semiconductor substrate 29. The connecting portion 81a extends in the extending direction of the connecting member 42, that is, along the direction perpendicular to the page of FIG. 16. The buried portion 81b is arranged immediately below the connecting portion 81a intermittently along the extending direction of the connecting portion 81a. A gate insulating film 82 is formed around the buried portion 81b, and the gate electrode 81 is insulated from the semiconductor substrate 29 by the gate insulating film 82.

According to this embodiment, by using the trench gate structure for the high-side transistor HQ, the on-resistance of the high-side transistor HQ can be reduced. The configuration, operation, and effect other than the foregoing in this embodiment are the same as those in the above first embodiment.

Next, a fifth embodiment of the invention is described.

Figure 17:
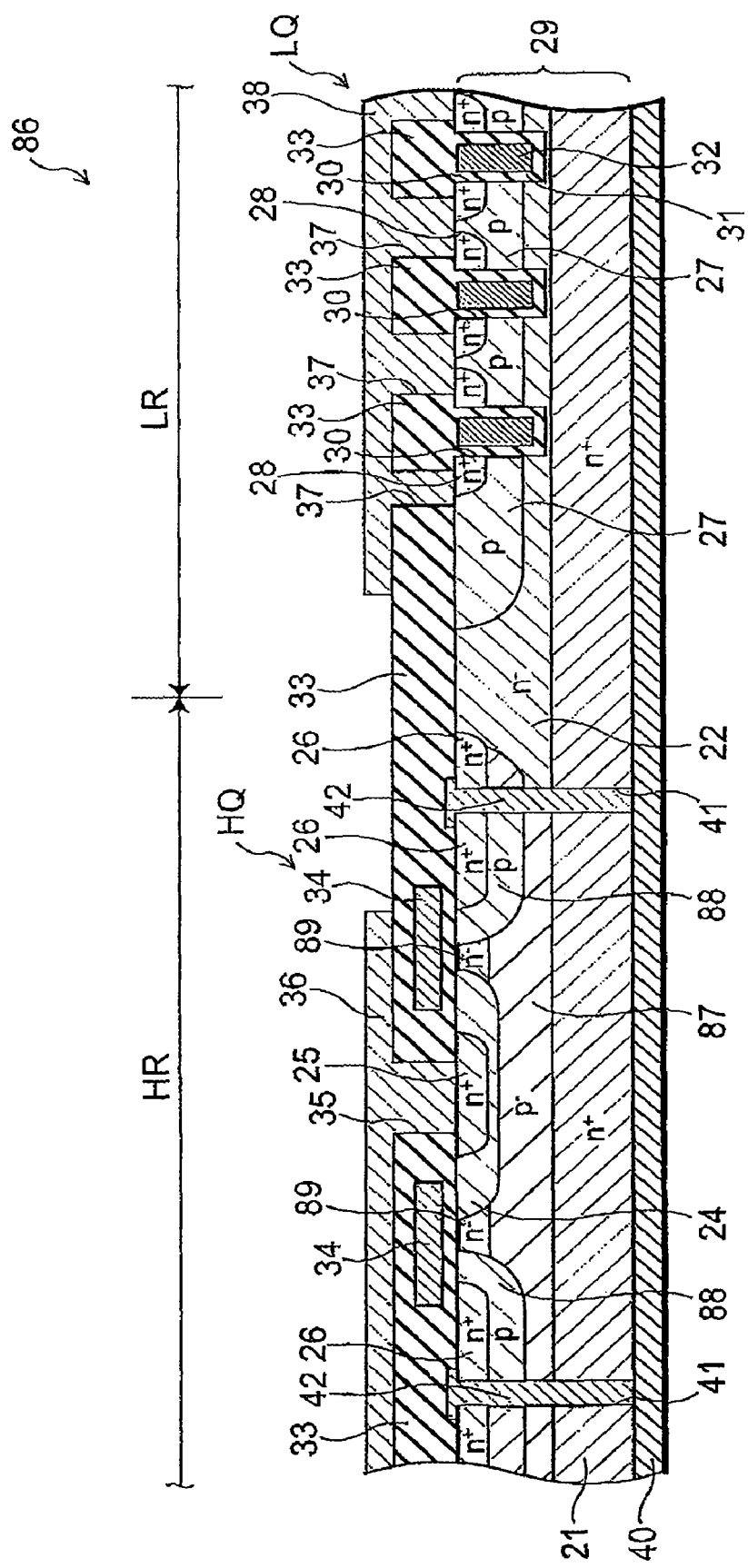
FIG. 17 is a cross-sectional view illustrating a semiconductor chip in a fifth embodiment of the invention.

FIG. 17 is a cross-sectional view illustrating a semiconductor chip in this embodiment.

As shown in FIG. 17, in the semiconductor chip 86 of this embodiment, the p-isolation layer of the lateral MOSFET is formed from a buried p-layer. More specifically, in the semiconductor chip 86, the high-side transistor region HR includes a $p^-$-type epitaxial layer 87 instead of the $n^-$-type epitaxial layer 22. A buried p-layer 88 having p-type conductivity is provided in part of the upper portion of the epitaxial layer 87, and the $n^+$-type region 26 is formed in part of the upper portion of the buried p-layer 88 so as to be surrounded by the buried p-layer 88 at its periphery and lower surface. An $n^-$-type region 89 is formed between the buried p-layer 88 and the n-type region 24 in the upper portion of the epitaxial layer 87.

According to this embodiment, when the high-side transistor HQ is turned off, a depletion layer extends from the interface between the burled p-layer 88 serving as a channel layer and the $n^-$-type region 89 into the $n^-$-type region 89. This alleviates electric field concentration and serves to increase the breakdown voltage. Furthermore, the length of the channel region can be shortened. The configuration, operation, and effect other than the foregoing in this embodiment are the same as those in the above first embodiment.

Next, a sixth embodiment of the invention is described.

Figure 18:
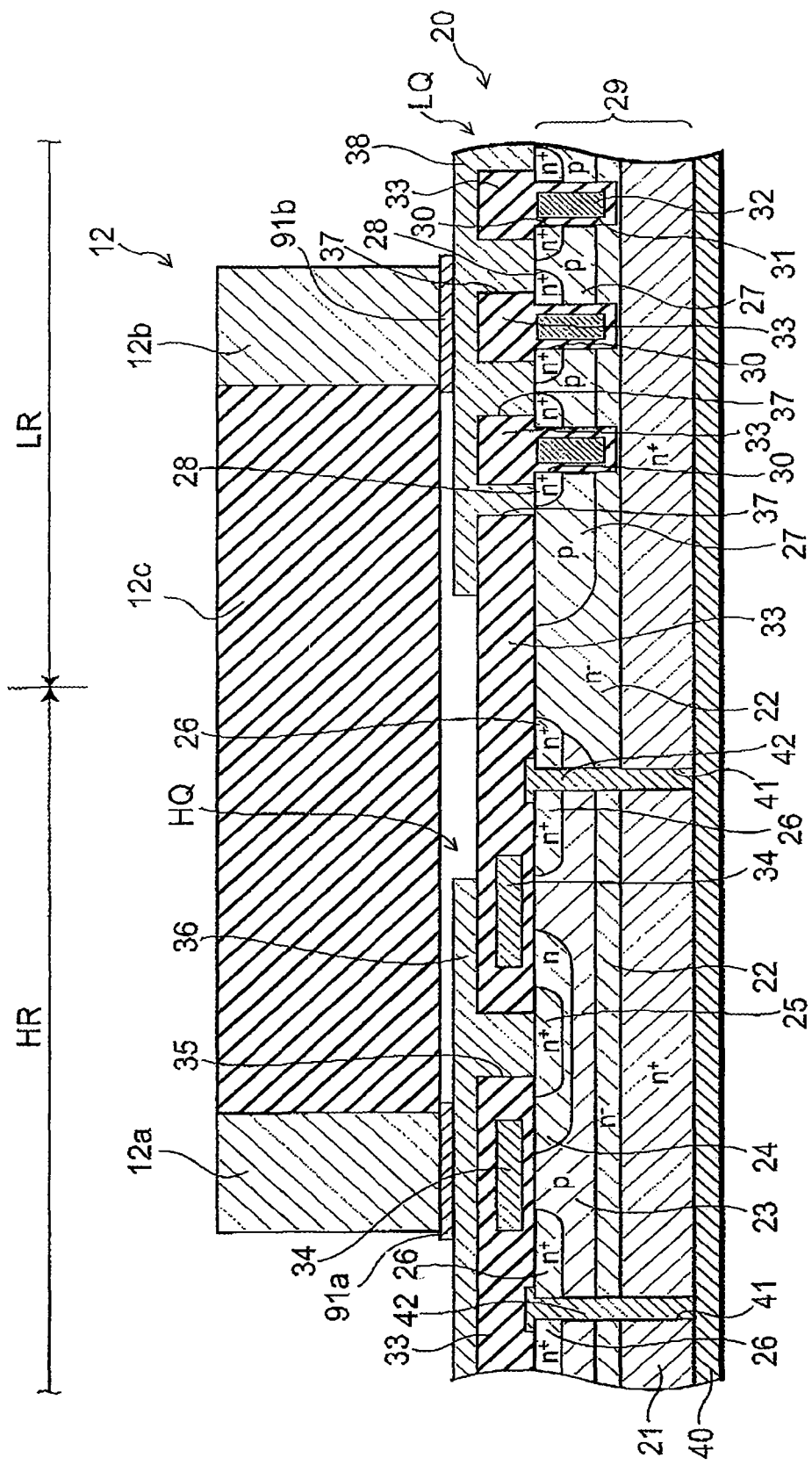
FIG. 18 is a cross-sectional view illustrating a semiconductor chip in a sixth embodiment of the invention.

FIG. 18 is a cross-sectional view illustrating a semiconductor chip in this embodiment.

As shown in FIG. 18, the DC-DC converter according to this embodiment is different from the DC-DC converter 1 (see FIGS. 1 and 2) according to the above first embodiment in that the capacitor 12 for power supply coupling is provided on the semiconductor chip.

More specifically, as shown in FIG. 18, in the DC-DC converter according to this embodiment, the capacitor 12 is placed immediately above the semiconductor chip 20. The capacitor 12 straddles both the high-side transistor region HR and the low-side transistor region LR.

The capacitor 12 includes a pair of electrodes 12a and 12b, and a dielectric film 12c placed between the electrode 12a and the electrode 12b and insulating the electrode 12a and the electrode 12b from each other. One electrode 12a of the capacitor 12 is placed immediately above the drain electrode 36 and connected to the drain electrode 36 through a connecting layer 91a. The other electrode 12b of the capacitor 12 is placed immediately above the source electrode 38 and connected to the source electrode 38 through a connecting layer 91b. For example, as viewed from above, the electrodes 12a and 12b are both shaped like a comb and mesh with each other without contact.

According to this embodiment, the capacitor 12 is placed immediately above the semiconductor chip 20, and a pair of electrodes 12a and 12b are directly connected to the drain electrode 36 and the source electrode 38, respectively. Thus, the parasitic inductance therebetween is reduced, and the voltage conversion efficiency of the DC-DC converter can be improved. The configuration, operation, and effect other than the foregoing in this embodiment are the same as those in the above first embodiment.

The invention has been described with reference to the embodiments and the variations thereof. However, the invention is not limited to these embodiments and variations. For example, the above embodiments and variations may be practiced in combination with each other. Furthermore, any addition, deletion, or design change of components, or any addition, omission, or condition change of processes in the above embodiments and variations suitably made by those skilled in the art are also encompassed within the scope of the invention as long as they fall within the spirit of the invention.

For example, in the above embodiments and variations, the connecting member is illustratively formed from a metal or alloy. However, the connecting member may be formed from a diffusion layer of semiconductor. Furthermore, in the above embodiments and variations, the control circuit 14 is illustratively formed on the same semiconductor chip as the output circuit 13. However, the control circuit may be formed on a different semiconductor chip. Moreover, in the above embodiments and variations, the smoothing circuit composed of the inductor 15 and the capacitor 16 is illustratively provided outside the semiconductor chip. However, the smoothing circuit may be formed on the same semiconductor chip as the output circuit 13.

Furthermore, in the above embodiments and variations, the transistors HQ and LQ are illustratively N-type transistors. However, the transistors HQ and LQ may be P-type transistors. In this case, the lateral MOSFET is a low-side transistor, and the vertical MOSFET is a high-side transistor. Moreover, in the above embodiments and variations, the semiconductor device is illustratively a DC-DC converter. However, the invention is not limited thereto, but suitably applicable to any semiconductor device which includes both lateral and vertical MOSFET having the same conductivity type.

Furthermore, in the above embodiments and variations, the source region of the lateral transistor is illustratively connected to the drain region of the vertical transistor through the connecting member and the backside electrode. However, the invention is not limited thereto. For example, the drain region of the lateral transistor may be connected to the drain region of the vertical transistor.

The invention claimed is:

1. A semiconductor device comprising:
   a semiconductor substrate;
   a lateral MOSFET formed in an upper portion of a first region of the semiconductor substrate;

a vertical MOSFET formed in a second region of the semiconductor substrate;
a backside electrode formed on a lower surface of the semiconductor substrate and connected to a lower region of source/drain regions of the vertical MOSFET; and
a connecting member penetrating the semiconductor substrate and connecting one of source/drain regions of the lateral MOSFET to the backside electrode.

2. The semiconductor device according to claim 1, further comprising:
a control circuit configured to control on/off of the lateral MOSFET and the vertical MOSFET;
an inductor with one end connected to the backside electrode; and
a capacitor connected between the other end of the inductor and a reference potential,
wherein an input potential is applied to one of an upper region of the source/drain regions of the vertical MOSFET and the other of the source/drain regions of the lateral MOSFET, and the reference potential is applied to the other thereof.

3. The semiconductor device according to claim 2, wherein the control circuit is formed on the semiconductor substrate.

4. The semiconductor device according to claim 1, further comprising:
a capacitor placed on the semiconductor substrate, one electrode thereof being connected to the upper region of the source/drain regions of the vertical MOSFET and the other electrode thereof being connected to the other of the source/drain regions of the lateral MOSFET.

5. The semiconductor device according to claim 1, wherein the connecting member is formed from a metal or alloy.

6. A semiconductor device comprising:
a first semiconductor layer of a first conductivity type;
a second semiconductor layer of a second conductivity type and a third semiconductor layer of the second conductivity type formed in regions spaced from each other in an upper portion of the first semiconductor layer;
a fourth semiconductor layer of the first conductivity type and a fifth semiconductor layer of the first conductivity type formed in regions spaced from each other in an upper portion of the second semiconductor layer;
a first electrode provided above the second semiconductor layer and immediately above a region between the fourth semiconductor layer and the fifth semiconductor layer;
a sixth semiconductor layer of the first conductivity type formed in part of an upper portion of the third semiconductor layer;
a second electrode buried through the sixth semiconductor layer and the third semiconductor layer to the first semiconductor layer and insulated from the sixth semiconductor layer, the third semiconductor layer, and the first semiconductor layer;
a backside electrode provided on a lower surface of the first semiconductor layer and connected to the first semiconductor layer; and
a connecting member penetrating the first semiconductor layer and connecting the fifth semiconductor layer to the backside electrode.

7. The semiconductor device according to claim 6, wherein
the fourth semiconductor layer is a drain region of a lateral MOSFET,
the fifth semiconductor layer is a source region of the lateral MOSFET,
the region of the second semiconductor layer between the fourth semiconductor layer and the fifth semiconductor layer is a channel region of the lateral MOSFET,
the first electrode is a gate electrode of the lateral MOSFET,
the sixth semiconductor layer is a source region of a vertical MOSFET,
the third semiconductor layer is a channel region of the vertical MOSFET,
the first semiconductor layer is a drain region of the vertical MOSFET, and
the second electrode is a gate electrode of the vertical MOSFET.

8. The semiconductor device according to claim 6, wherein the first semiconductor layer includes:
a first-conductivity-type substrate made of single crystal silicon; and
a first-conductivity-type epitaxial layer made of single crystal silicon and having a lower impurity concentration than the first-conductivity-type substrate.

9. The semiconductor device according to claim 6, further comprising:
a single third electrode connected to the fourth semiconductor layer; and
a single fourth electrode connected to the sixth semiconductor layer.

10. The semiconductor device according to claim 6, wherein the connecting member is shaped like a stripe as viewed from above.

11. The semiconductor device according to claim 6, wherein the connecting member includes:
a trunk portion extending in one direction; and
a plurality of branch portions extending in a direction crossing the trunk portion.

12. The semiconductor device according to claim 6, wherein the connecting member extends in one direction while meandering as viewed from above.

13. The semiconductor device according to claim 6, wherein the connecting member is shaped like a dashed line as viewed from above.

14. The semiconductor device according to claim 6, wherein a plurality of the connecting members are arranged in a matrix configuration as viewed from above.

15. The semiconductor device according to claim 6, wherein the connecting member is formed from a metal or alloy.

16. The semiconductor device according to claim 6, further comprising:
a control circuit formed in the upper portion of the first semiconductor layer and configured to apply control signals having mutually opposite phases to the first electrode and the second electrode;
an inductor with one end connected to the backside electrode; and
a capacitor connected between the other end of the inductor and a reference potential,
wherein an input potential is applied to the fourth semiconductor layer, and the reference potential is applied to the sixth semiconductor layer.

17. The semiconductor device according to claim 6, further comprising:
a single third electrode connected to the fourth semiconductor layer;
a single fourth electrode connected to the sixth semiconductor layer; and
a capacitor for power supply coupling,
wherein one electrode of the capacitor for power supply coupling is placed immediately above the third electrode and connected to the third electrode, and
the other electrode of the capacitor for power supply coupling is placed immediately above the fourth electrode and connected to the fourth electrode.

* * * * *